310-334
2/14/78 OR 4,074,152 SR

United States Patent [19] [11] 4,074,152
Asai et al. [45] Feb. 14, 1978

[54] ULTRASONIC WAVE GENERATOR

[75] Inventors: Kiyokazu Asai; Akihiro Takeuchi, both of Nagoya, Japan

[73] Assignee: Kabushiki Kaisha Toyota Chuo Kenkyusho, Japan

[21] Appl. No.: 620,059

[22] Filed: Sept. 30, 1975

[30] Foreign Application Priority Data

Dec. 28, 1974 Japan .................................. 49-3508

[51] Int. Cl.[2] .............................................. H01L 41/04

[52] U.S. Cl. ..................................... 310/334; 310/369

[58] Field of Search ...................... 310/8, 8.2, 8.3, 8.7, 310/26; 116/237 A, DIG. 19; 73/67.2; 259/1 R, DIG. 15, DIG. 41, DIG. 44; 239/4, 102

[56] References Cited

U.S. PATENT DOCUMENTS

| | | | |
|---|---|---|---|
| 2,190,666 | 2/1940 | Kallmeyer | 310/26 X |
| 2,725,219 | 11/1955 | Firth | 310/26 X |
| 3,015,961 | 1/1962 | Roney | 340/8 MM |
| 3,140,859 | 7/1964 | Scarpa | 310/8.7 X |
| 3,184,841 | 5/1965 | Jones et al. | 310/26 X |
| 3,214,101 | 3/1964 | Perron | 310/8.7 X |
| 3,400,892 | 9/1968 | Ensminger | 310/8.7 X |
| 4,034,244 | 7/1977 | Asai et al. | 310/8.2 |

*Primary Examiner*—Mark O. Budd

*Attorney, Agent, or Firm*—Oblon, Fisher, Spivak, McClelland & Maier

[57] ABSTRACT

An ultrasonic wave generator includes an ultrasonic oscillator, an ultrasonic wave transducer connected to the oscillator, a mechanical vibration amplifying member, and an ultrasonic vibratory member. An increased thickness portion, which projects from a portion of the circumferential surface of the ultrasonic vibratory member and from a side wall portion of the mechanical vibration amplifying member at a connecting portion of the ultrasonic vibratory member and the mechanical vibration amplifying member, is integrally formed upon the ultrasonic vibratory member and the mechanical vibration amplifying member whereby the cross-sectional area of the connecting portion between the ultrasonic vibratory member and mechanical vibration amplifying member is gradually changed. With this improvement, the mechanical strength of the connecting portion between the ultrasonic vibratory member and the mechanical vibration amplifying member is increased, the positive transmission of the ultrasonic waves from the mechanical vibration amplifying member to the ultrasonic vibratory member is insured, fatigue failure and cracking of the connecting portion is effectively prevented, and the ultrasonic waves are generated from the ultrasonic vibratory member in a stable manner for a long period of time.

13 Claims, 49 Drawing Figures

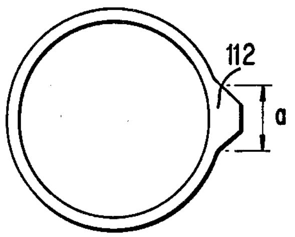
FIG. 14a
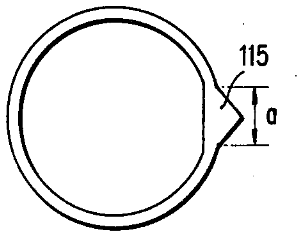
FIG. 15a
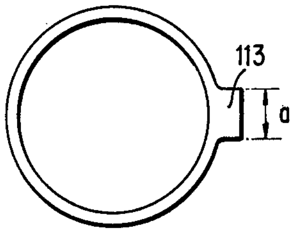
FIG. 14b
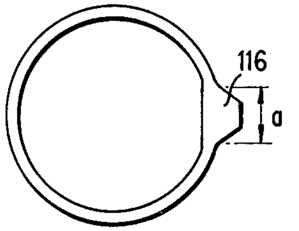
FIG. 15b
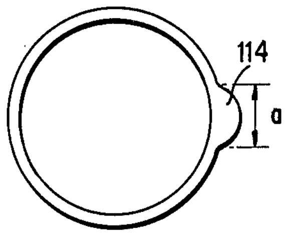
FIG. 14c
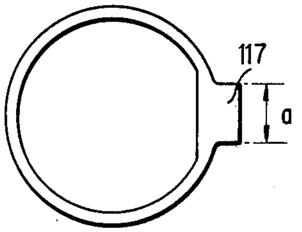
FIG. 15c
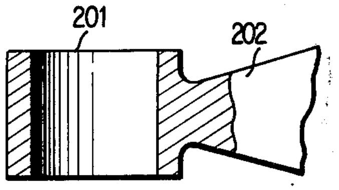
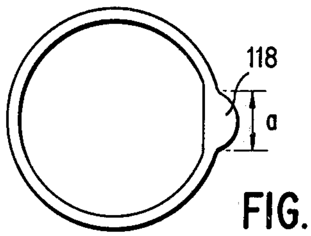
FIG. 15d
FIG. 17b
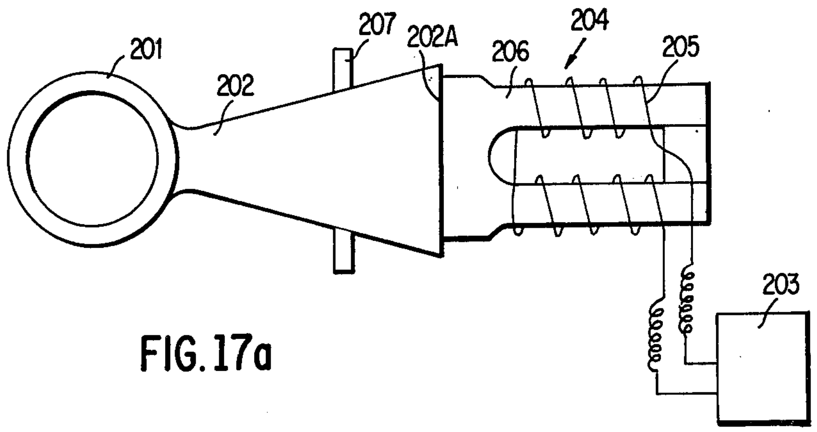
FIG. 17a

ULTRASONIC WAVE GENERATOR

BACKGROUND OF THE INVENTION

1. Field of the Invention

This invention relates to an ultrasonic wave generator having a vibratory member of a hollow cylindrical body and wherein, at a connecting portion of a vibratory member and a mechanical vibration amplifying member, an increased thickness portion projecting from the two members is integrally formed.

2. Description of the Prior Art

According to exemplary prior art ultrasonic wave generators, an ultrasonic wave horn is secured to a piezo-electric transducer or a magnetostrictive transducer whereby an ultrasonic wave is generated from the end face of the horn, with the amplitude of the wave being amplified by means of the horn, or alternatively an ultrasonic wave is generated from the cylindrical surface of a cylindrical ultrasonic wave transducer. With the aforenoted ultrasonic wave horn, it is imperative that the cross-sectional area of the tip portion of the horn be decreased in order to amplify the amplitude of an ultrasonic wave, and consequently, ultrasonic vibrations having a large amplitude may only be obtained from a very limited area of the ultrasonic wave generator. On the other hand, an ultrasonic wave generator using an ultrasonic wave transducer having a cylindrical configuration facilitates the generation of an ultrasonic wave from a large area of the aforenoted cylindrical surface, however, it fails to amplify the amplitude of an ultrasonic wave by means of an ultrasonic wave horn or the like, and consequently, the result is that an ultrasonic wave of a large amplitude is not in fact generated.

One of the attempts for avoiding the aforenoted disadvantages confronted with the aforenoted prior art ultrasonic wave generators, which has been proposed by the present inventors, is an arrangement whereby an ultrasonic vibratory member of a hollow cylindrical body, having a uniform wall thickness, has its outer circumferential surface secured to the tip of an ultrasonic wave horn which has also been developed by the inventors, whereby the aforenoted vibratory member is subjected to vibration due to the ultrasonic vibrations having an amplified amplitude, thereby generating an ultrasonic wave from its cylindrical surface (See Japanese Patent Application No. 36506/1973, and United States Patent Application Ser. No. 453,987, filed Mar. 22, 1974), now abandoned.

According to such ultrasonic wave generators, the vibratory member of the hollow cylindrical body generates ultrasonic vibrations in a direction perpendicular to the axis of the cylinder whereby a large area of the inner and outer circumferential surfaces of the hollow cylindrical body may be utilized as the vibration-generating surfaces, while the vibratory member is subjected to flexural vibration, thereby generating an ultrasonic vibration of a large amplitude.

However, this attempt still suffers from shortcomings in that because the cost of manufacturing the vibratory member of the hollow cylindrical body having a uniform wall thickness, and the horn, are high if they are manufactured as an integral construction, they are in fact fabricated separately whereby the vibratory member is subsequently secured to the tip portion of the horn by means of suitable fastening means, such as, for example, a bolt. In this condition, however, during long periods of operation with a large amplitude of vibration, insufficient mechanical strength and fatigue cracking, within the coupling portion of the vibratory member and the tip portion of the horn, is exhibited due to the existence of the poor coupling by means of the bolt at the small circular cross-sectional area of the aforenoted coupling portion. In addition, intimate contact between both members to be coupled together is required within such a device when coupling the vibratory member of the hollow cylindrical body to the tip portion of the horn, and this substantially increases the number of man-hours required for the manufacture of the ultrasonic wave generator, and the same also exhibits poor reliability.

SUMMARY OF THE INVENTION

Accordingly, it is an object of the present invention to provide an ultrasonic wave generator which generates, in a stable manner, an ultrasonic wave of a large amplitude upon the inner and outer circumferential surfaces of a vibratory member having a large area without fatigue failure and cracking for a long period of time.

Another object of the present invention is to provide an ultrasonic wave generator within which an increased thickness portion, projecting outwardly from the outer circumferential surface of an ultrasonic vibratory member and a mechanical vibration amplifying member, is integrally formed at the connecting portion of the two members so as to thereby increase the mechanical strength of the connecting portion between the two members and whereby an ultrasonic wave is able to be generated from the ultrasonic vibratory member in a stable manner for a long period of time.

A further object of the present invention is to provide an ultrasonic wave generator within which at least one of the joint portions of the vibratory member and the mechanical-vibration amplifying portion is formed with a rib structure as the increased thickness portion, and the vibratory member and the mechanical vibration amplifying portion are integrally coupled through means of the rib structure so as to thereby increase the strength of the joit of the aforenoted members while enabling consistent and stabilized generation of ultrasonic waves for a long period of time and for preventing fatigue failure or cracking within the joint portion, even if the vibratory member is subjected to vibration for a long period of time.

A still further object of the present invention is to provide an ultrasonic wave generator within which a hollow cylindrical member and one end of an amplitude amplifying portion secured to the hollow cylindrical member are formed integrally with each other in a mechanical vibration amplifying portion so as to thereby increase the mechanical strength of the coupling portion interposed between the vibratory member and the amplitude amplifying portion, as well as for insuring the positive or steady transmission of an ultrasonic wave to the vibratory member whereby an ultrasonic wave may be generated in a stable manner for a long period of time while preventing fatigue failure and cracking within the aforenoted coupling portion even if the vibratory member is subjected to vibration for a long period of time.

A still yet further object of the present invention is to provide an ultrasonic wave generator having a mechanical vibration amplifying portion which includes one member having an ultrasonic vibratory member integrally formed therewith through means of a connecting portion with an increased thickness portion thereof and another member for securing the same to an ultrasonic wave transducer, which members are integrally secured together by means of bolts extending therethrough so as to thereby increase the mechanical strength of the connecting portion of the amplifying and transducer members and the connecting portion between the ultrasonic vibratory member and the mechanical vibration amplifying member, and for facilitating the generation of ultrasonic waves from the ultrasonic vibratory member in a stable manner for a long period of time.

The foregoing and other objectives are achieved in accordance with the present invention through the provision of an ultrasonic wave generator which includes an ultrasonic wave transducer, connected to an ultrasonic wave oscillator, for transforming an electrical oscillation into a mechanical vibration, a mechanical vibration amplifying member, having one end integrally secured to one end of the ultrasonic wave transducer, for amplifying the amplitude of the mechanical vibration transmitted from the ultrasonic wave transducer, and an ultrasonic vibrating member of a hollow cylindrical body of a predetermined wall thickness, and having its outer circumferential surface integrally connected to the other end of the mechanical vibration amplifying member. An increased thickness portion, which projects outwardly from the outer circumferential surface of the ultrasonic vibratory member and from a side wall portion of the mechanical vibration amplifying member at the connecting portion of the ultrasonic vibratory member and mechanical vibration amplifying member, and which is integrally formed upon the ultrasonic vibratory member and the mechanical vibration amplifying member whereby the cross-sectional area of the connecting portion of the ultrasonic vibratory member and the mechanical vibration amplifying member gradually changes, is provided for increasing the mechanical strength of the connecting portion between the ultrasonic vibratory member and the mechanical vibration amplifying member, for insuring the positive transmission of the ultrasonic waves from the mechanical vibration amplifying member to the ultrasonic vibratory member, for preventing the fatigue failure and cracking of the connecting portion, and for generating the ultrasonic waves from the ultrasonic vibratory member in a stable manner for a long period of time.

According to the present invention, there is provided an ultrasonic wave generator which may use a vibratory member of increased size, so as to increase the joint strength between the vibratory member and the mechanical vibration amplifying portion, by the provision of an increased thickness portion integral with at least one of the joint portions of the vibratory member and the mechanical-vibration amplifying portion, whereby an ultrasonic wave may be generated from a large area of the vibrating surface of the vibratory member.

More specifically, in accordance with a first aspect of the present invention, there is provided an ultrasonic wave generator which includes an ultrasonic wave transducer connected to an ultrasonic wave oscillator for transforming electrical oscillations into mechanical vibrations, and a mechanical-vibration amplifying portion integrally secured to the ultrasonic wave transducer at one end thereof for amplifying the amplitude of the mechanical vibrations transmitted from the ultrasonic wave transducer. The generator also includes a vibratory member of a hollow cylindrical body and of small wall thickness, with its outer circumferential surface secured to the other end of the mechanical-vibration amplifying portion, at least one of the joint portions of the vibratory member and the mechanical-vibration amplifying portion being formed with a rib structure as an increased thickness portion whereby the vibratory member is integrally coupled to the mechanical-vibration amplifying portion through means of the increased thickness portion.

According to one example of the first aspect of the present invention, the vibratory member of a hollow cylindrical body is subjected to vibration so as to generate ultrasonic waves upon the inner and outer circumferential surfaces of the vibratory member, that is, upon a vibrating surface of a large surface area of the vibratory member.

According to another example of the first aspect of the present invention, the aforenoted vibratory member is subjected to a proper order of flexural vibration whereby an ultrasonic wave of a large amplitude is generated upon the inner and outer circumferential surfaces of the vibratory member.

According to a further example of the first aspect of the present invention, an increased thickness portion is formed upon at least one of the joint portions of the vibratory member and the mechanical-vibration amplifying portion whereby both members are coupled to each other through means of the aforenoted increased thickness portion thereby increasing the strength of the joint of both members for enabling consistent and stabilized generation of the ultrasonic waves for a long period of time and for preventing fatigue failure and cracking within the joint of both members even if the vibratory member is subjected to vibration for a long period of time.

According to a still further example of the first aspect of the present invention, an increase in the strength of the joint of the vibratory member and the mechanical-vibration amplifying portion due to the provision of the increased thickness portion permits the use of a larger sized vibratory member for generating ultrasonic waves from a large surface area of the vibrating surface of the vibratory member.

The second aspect of the present invention is characterized in that an ultrasonic vibratory member and an output portion of the mechanical vibration amplifying member integrally form one member. In accordance with the second aspect of the present invention, there is provided an ultrasonic wave generator which includes an ultrasonic wave transducer connected to an ultrasonic wave oscillator for transforming electrical vibrations into mechanical vibrations, and a mechanical vibration amplifying portion which includes a joint portion integral with the ultrasonic wave transducer, an amplitude amplifying portion which amplifies the amplitude of the mechanical vibrations transmitted from the ultrasonic wave transducer, and a hollow cylindrical body which is integrally coupled and formed with the tip of the amplitude amplifying portion, with its axis being disposed perpendicular to the amplitude amplifying portion, the hollow cylindrical body being open at its axially opposite ends.

In accordance with the ultrasonic wave generator having the aforenoted arrangement, the vibratory member of the hollow cylndrical body is subjected to vibration whereby an ultrasonic wave is generated from the inner and outer circumferential surfaces of the vibratory member, that is, from the vibrating surfaces having a large surface area. In addition, the vibratory member of the hollow cylindrical body is subjected to a wave-like or petaloid flexural vibration whereby an ultrasonic wave of a large amplitude may be generated from the inner and outer circumferential surfaces of the vibratory member.

Still further, according to the second aspect of the present invention, there is provided a joint portion, an amplitude amplifying portion, and a hollow cylindrical body coupled to the tip of the amplitude amplifying portion within the mechanical vibration amplifying portion, which are formed integrally with each other, whereby the mechanical strength of the coupling portion between the vibratory member of the hollow cylindrical body and the amplitude amplifying portion is increased, and an ultrasonic wave may be generated in a stable manner for a long period of time due to the positive or steady transmission of an ultrasonic wave to the vibratory member while the same prevents fatigue failure and cracking within the coupling portion even if the aforenoted vibratory member is subjected to continuous vibration for a long period of time.

According to another aspect of the present invention, there is provided an increased thickness portion for the connecting portion between the vibratory member and the mechanical vibration output end, thereby enabling the use of a vibratory member of a long, hollow cylndrical body, while retaining the aforenoted functions and advantages of the invention, and generating an ultrasonic wave from the vibrating surface of the vibratory member which has a large vibratory surface area.

In accordance with a third aspect of the present invention, there is provided an ultrasonic wave generator which includes the tip portion of the mechanical-vibration amplifying portion being integrally formed with the ultrasonic vibratory member of the hollow cylindrical body while a coupling portion is provided within the mechanical-vibration amplifying portion in an attempt to increase the mechanical strength of the coupling portion as well as to insure the transmission of an ultrasonic wave to the vibratory member, the same thereby enabling the generation of a stable ultrasonic wave for a long period of time. In addition, even if the vibratory member is subjected to continuous vibration for a long period of time and with a large amplitude, there may be provided an ultrasonic wave generator which may prevent fatigue cracking within the aforenoted coupling portion.

Still further, according to the third aspect of the present invention, the mechanical-vibration amplifying portion is divided into two components, that is, a tip portion integral with the aforenoted vibratory member, and a root portion serving as a coupling portion adapted to secure the amplifying portion to an ultrasonic wave transducer. In this respect, it should be noted that the aforenoted tip portion and root portion are used for amplifying the amplitude of vibration, the aforenoted tip portion being ridigly and integrally fastened to the root portion by means of a bolt. As a result, the coupling of the vibratory member to the mechanical-vibration amplifying portion is simplified and rendered positive, and an ultrasonic wave generator having high reliability and adapted for practical applications is provided.

These objects and features of the third aspect of the present invention may readily be obtained within an ultrasonic wave generator constructed in accordance with the present invention wherein there is included an ultrasonic wave transducer adapted to transform electrical vibrations into mechanical vibrations and which is connected to an ultrasonic wave oscillator, a mechanical-vibration amplifying portion secured to the ultrasonic wave transducer portion for amplifying the amplitude of the mechanical vibrations which are being transmitted from the ultrasonic wave transducer portion, and an ultrasonic vibratory member of a hollow cylindrical body having axially opposite open end portions with the axial line thereof disposed perpendicular to that of the ultrasonic-wave amplifying portion. The aforenoted mechanical-vibration amplifying portion is characterized in that the mechanical-vibration amplifying portion is divided into two components, that is, an amplitude-amplifying root portion adapted to secure the mechanical-vibration amplifying portion to the ultrasonic wave transducer portion, and an amplitude-amplifying tip portion integral with the ultrasonic vibratory member of the hollow cylindrical body, elongated holes, having threaded walls, being provided in such a manner as to extend through the components in the axial direction and in coaxial relation thereto, whereby a bolt is adapted to be threadedly engaged within the aforenoted elongated holes which extend substantially the entire length of the aforenoted two components thus integrally securing the two components to each other.

In operation of the ultrasonic wave generator according to the third aspect of the present invention, the amplitude of the mechanical vibrations which have been transformed by means of the ultrasonic wave transducer are amplified by means of the mechanical-vibration amplifying portion whereby the ultrasonic vibrations of an amplitude thus amplified are transmitted to the circumferential surface of the vibratory member of the hollow cylindrical body so as to bring the vibratory member into resonant, flexural vibration. This then permits the generation of an ultrasonic wave of a large amplitude in a stable manner for a long period of time, from a large surface area of the vibrating surfaces, that is, the inner and outer circumferential surfaces of the vibratory member, while preventing fatigue cracking within the coupling portion thereof.

More specifically, the features of the third aspect of the present invention may be summarized as follows:

(1) The mechanical-vibration amplifying portion is divided into two components, that is, an amplitude-amplifying tip portion integral with the aforenoted vibratory member, and an amplitude-amplifying root portion having a coupling portion, whereby the aforenoted two components may be fastened together, by means of a bolt having substantially the same length as that of the ultrasonic-vibration amplifying portion, in such a manner that the resonance frequency of the longitudinal vibration of the bolt itself is in coincidence with that of the longitudinal vibration of the aforenoted ultrasonic-vibration amplifying portion. As a result, the mechanical vibration amplifying portion may act as an ultrasonic wave horn which is well adapted for use in amplifying the amplitude of vibration. Accordingly, even if the aforenoted vibratory member is coupled to the mechanical-vibration amplifying portion, the bolt fastening means will not impair the function of the mechanical-vibration amplifying portion, whereby an ultrasonic wave may nevertheless be efficiently transmitted.

(2) In addition, the mechanical-vibration amplifying portion is divided into two components which are to be coupled at a point intermediate the axial length of the mechanical-vibration amplifying portion, and in addition, both components have threaded bores whereby the two components are able to be fastened together by means of a bolt having substantially the same length as that of the entire length of the mechanical-vibration amplifying portion. In this respect, the length of the holes or bores may be optionally selected, depending upon the strength required for the coupling portion. For example, the use of a through-bolt in such a case provides a threaded coupling portion covering a considerable length which insures a high coupling strength when subjected to high frequency vibration, as well as allowing stable vibration for the ultrasonic vibratory member, having a large mass and of a hollow cylindrical body, for a long period of time.

(3) Still further, the aforenoted vibratory member is coupled to the mechanical-vibration amplifying portion substantially at the mid point of the mechanical-vibration amplifying portion, rather than at the tip portion thereof as in the prior art devices, thus insuring resonance between the vibratory member and the mechanical-vibration amplifying portion and permitting stable, continuous vibration for the vibratory member for a long period of time.

In other words, according to the prior art devices, fastening of the vibratory member to the amplitude-amplifying portion is established between the circumferential surface of a hollow cylindrical body and the tip of the amplitude-amplifying portion. More specifically, the longitudinal vibration within the amplitude-amplifying portion is transformed into flexural vibration within the vibratory member through means of the aforenoted coupling portion. Since the vibratory member is coupled to the tip of the amplitude-amplifying portion, vibratory displacement of the natural flexural vibration mode of the vibratory member is somewhat constrained within the aforesaid coupling portion, and it follows that high stresses occur upon such coupling surfaces.

Due to the aforenoted constraint upon the vibratory displacement there may not be achieved a constant constraint upon the vibratoy displacement, over the entire range of the coupling surfaces of the vibratory member, when utilizing fastening means, such as for example, a bolt, and this is particularly true of the case wherein a coupling portion is subjected to high-frequency vibration for a long period of time. In other words, the peripheral portions of the coupling surfaces are apt to be peeled, so that the condition constraining the vibratory member may vary. This, in turn, varies the resonance frequency of flexural vibration of the vibratory member, thus failing to maintain resonance between the vibratory member and the mechanical-vibration amplifying portion.

In contrast thereto, as the present invention suggests that the coupling together of the two components be established by means of a bolt substantially at the mid point of the mechanical-vibration amplifying portion, the two components are so designed as to cause vibration in an integral fashion and within the identical vibratory mode at the identical phase, whereby both components will not constrain the mutual vibratory-displacement of the two components and will avoid the concentration of vibratory stresses upon the coupling surfaces thereof. Accordingly, the coupling portion of the invention is extremely stable to high-frequency vibration. In addition, the vibratory member is integrally formed upon the tip portion of the mechanical-vibration amplifying portion whereby the vibratory-displacement constraining condition upon the coupling portion of the vibratory member may be maintained constant, and this in turn insures the desired resonance between the vibratory member and the mechanical-vibration amplifying portion.

Yet further, in accordance with the present invention, the vibratory member of the hollow cylindrical body is integrally formed upon the tip portion of the mechanical-vibration amplifying portion, through means of an increased thickness portion, whereby the cross-sectional area of the coupling portion is increased, and the stress concentration may be prevented, due to the fact that the surface of the vibratory member is smoothly united into the surface of the tip portion of the mechanical-vibration amplifying portion. This then increases the mechanical strength of the coupling portion and insures the positive transmission of the ultrasonic waves to the vibratory member whereby there may be achieved stable generation of an ultrasonic wave for a long period of time. In addition, even if the vibratory member is subjected to continuous vibration at a large amplitude and for a long period of time, fatigue cracking within the coupling portion may be prevented.

Still yet further, the mechanical-vibration amplifying portion is divided into two components, that is, an amplitude-amplifying tip portion integral with the aforenoted vibratory member, and an amplitude-amplifying root portion having a coupling portion, both components being integrally fastened together by means of a through-bolt which is designed so as to engage threaded bores which are defined over the entire axial length of the components whereby the vibratory member may be readily and positively fastened to the mechanical-vibration amplifying portion, thereby facilitating the manufacture of an ultrasonic wave generator having high reliability and high performance, which of course meets the objects of the present invention.

In practicing the first aspect of the present invention, there are provided three embodiments which include various modifications and alterations and a description will now be given of the first embodiment of the first aspect of the present invention. The first embodiment of the first aspect of the present invention includes the feature that the rib structure, as the aforenoted increased thickness portion, is formed upon the joint portion of the vibratory member and the mechanical-vibration amplifying member. The first embodiment also includes an ultrasonic wave generator within which an ultrasonic vibratory member of a hollow cylindrical body having an increased thickness portion, that is, a rib structure, is integrally secured to the tip portion of an ultrasonic vibration amplifying metal block which serves as a mechanical vibration amplifying portion which is, in turn, connected to piezoelectric elements or magnetostrictive elements of an ultrasonic wave transducer for amplifying the mechanical vibrations. In this manner, electrical oscillations are transformed into mechanical vibrations by means of the aforenoted elements, the amplitude of the mechanical vibrations is then amplified by means of the ultrasonic-vibration amplifying metal block and subsequently, the vibrational displacement of the amplitude thus amplified is uniformly transmitted to the side, circumferential surface of the vibratory member through means of the rib formed upon the ultrasonic vibratory member of the cylindrical body, whereby the circumferential surface of the vibratory member is subjected to vibration of a large amplitude within the radial direction thereof or to a wave-like or petaloid flexural vibration of a proper order, thereby generating ultrasonic waves upon the inner and outer circumferential surfaces of the aforenoted cylindrical body.

In this case, a typical example of a rib formed upon the cylindrical vibratory member is given as an increased thickness portion of a columnar shape which extends over the entire axial length of the cylindrical body in a direction parallel with the longitudinal axis of the cylindrical body. As a result, the increased thickness portion of the cylindrical body exhibits a greater rigidity than the other portions of the cylindrical body, and in the case of the first embodiment, the ultrasonic vibratory member having such a rib is coupled at its rib portion to the tip portion of the ultrasonic vibration amplifying metal block, that is, upon the side surface of the columnar rib having a high bending rigidity and extending over the entire axial length of the cylindrical body. In this manner, the vibrational displacement of the ultrasonic vibrations amplified by means of the ultrasonic vibration amplifying metal block may be uniformly transmitted to the cylindrical body over the entire length thereof, whereby as will be described hereinafter, the cylindrical ultrasonic vibratory member may cause a wave-like or petaloid flexural vibration in a single vibratory mode at a uniform vibrational displacement over the entire length thereof.

Accordingly, a vibratory member of a cylindrical body which has a rib, in accordance with the first embodiment, is free of the different type vibrating modes, thus presenting extremely stabilized flexural vibration, and in addition, abnormal vibratory stress is not created within the vibratory member. As a result, vibration of a large amplitude will not lead to damage within the vibratory member due to abnormal vibratory stresses, and still further, the ultrasonic vibratory member of the cylindrical body having such a rib effectively produces the ultrasonic vibrations due to the fact that the design of the rib has a sufficiently high rigidity and there results a large surface area of the vibrating portion, especially in the instance of the vibratory member having a considerable length in the axial direction of the cylindrical body.

Still yet further, in accordance with the first embodiment, since the ultrasonic vibratory member having a rib is coupled to the ultrasonic-vibration-amplifying metal block through means of the rib, that is, an increased thickness portion, no appreciable stress concentration is incurred within the joint portion of both members, and the joint portion exhibits an extremely high degree of strength and allows the mechanical vibrations to be properly transmitted. Thus, the joint portion of the ultrasonic vibratory member having the rib may withstand ultrasonic vibrations of a large amplitude for a long period of time thereby permitting continuous generation of ultrasonic waves for a long period of time.

The inner diameter and outer diameter of the cylindrical ultrasonic vibratory member should be so designed as to cause resonance in accordance with the frequency of the electrical oscillations to be fed to elements thereof. As the aforenoted dimensions are dependent upon two factors, that is, the frequency and the order of flexural vibration, the optional selection among the orders of the flexural vibrations thereby permits a free choice in the aforenoted dimensions without any limitation. Accordingly, an ultrasonic wave of a large amplitude may be generated upon the vibrating surfaces of an extensively large area, that is, upon the inner and outer circumferential surfaces of the vibratory member, without limitation as to the size of the vibratory surfaces.

A description will now be given of the second embodiment of the present invention, which features the presence of a rib structure as an increased thickness portion fromed upon the joint portion of the mechanical-vibration amplifying portion and the vibratory member. In accordance with such second embodiment, an increased thickness portion, having a configuration which is especially suited for intimate engagement with the side circumferential surface of the hollow cylindrical body of the vibratory member, is formed upon the joint portion, that is, the output end of the mechanical vibration amplifying portion, the aforenoted increased thickness portion having a length the same as or nearly that of the axial length of the vibratory member, and the increased thickness portion of the mechanical vibration amplifying portion is integrally and rigidly secured to the side, circumferential surface of the vibratory member by suitable fastening means, such as, for example, bolts and nuts or by other suitable bonding means, such as, for example, brazing and welding.

The second embodiment having the aforesaid arrangement presents increased strength for the joint portion and prevents stress concentration due to the fact that the vibratory member is secured to a relatively large area of the joint portion of the mechanical-vibration amplifying portion. This then prevents fatigue failure or cracking within the joint portion due to vibrational stresses even if the vibratory member is subjected to vibration at a large amplitude for a long period of time. As in the first embodiment, the second embodiment permits the use of a vibratory member of a large size, as well as the generation of ultrasonic vibrations upon the vibrating surfaces of a large surface area, in addition to various other advantages incident thereto.

A third embodiment will now be described, which third embodiment features the rib structure as the increased thickness portion of the present invention as being formed upon both joint portions of the mechanical-vibration amplifying portion and the vibratory member, and in accordance with such an embodiment, an increased thickness portion in the form of a rib is formed upon the vibratory member, while another increased thickness portion is likewise formed upon the joint portion, that is, the output end of the mechanical-vibration amplifying portion, the aforenoted former increased thickness portion having a length substantially the same as the axial length of the vibratory member while the latter increased thickness portion has a tip having a configuration which is best suited for the initmate engagement with the outer circumferential surface of the vibratory member having the rib. In this manner, both members are securely coupled together by means of bolt and nut fastening means or other suitable means, such as, for example, brazing and welding, through means of both increased thickness portions.

The third embodiment having the aforesaid arrangement improves the bending strength and joint strength of the vibratory member due to the provision of the increased thickness portion upon the vibratory member, while it also improves the joint strength within the joint portion of the mechanical vibration amplifying portion due to the provision of the increased thickness portion formed thereon and in addition, prevents stress concentration at the joint of both members due to the vibratory member being secured to the mechanical vibration amplifying portion by means of a large joint surface. As a result, the third embodiment may present further increased joint strength than those of the first and second embodiments, and accordingly, the third embodiment further effectively prevents fatigue failure and cracking within the joint of both members due to vibrational stresses, thereby improving the durability of the vibratory member, as well as enabling the use of a vibratory member of a large size, with the result of the generation of ultrasonic vibrations from a larger surface area.

BRIEF DESCRIPTION OF THE DRAWINGS

Various other objects, features, and attendant advantages of the present invention will be more fully appreciated as the same becomes better understood from the following detailed description when considered in connection with the accompanying drawings, in which like reference characters designate like or corresponding parts throughout the several views, and wherein:

FIGS. 14(*a*), 14(*b*) and 14(*c*) are plan views of modified cylindrical ultrasonic vibratory members having ribs thereon;

FIGS. 15(*a*), 15(*b*), 15(*c*) and 15(*d*) are additional views similar to those of FIGS. 14(*a*)-14(*c*);

FIGS. 17(*a*) and 17(*b*) are a plan view, and a partial, vertical cross-sectional view, of a seventh modification of the ultrasonic wave generator constructed in accordance with the present invention;

DETAILED DESCRIPTION OF THE ILLUSTRATED EMBODIMENTS

Figure 1A:
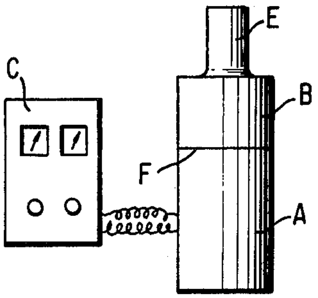
FIGS. 1 and 2 are schematic views of prior art ultrasonic wave generators.
Figure 1B:
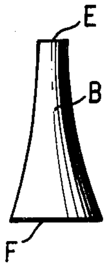
Figure 1C:
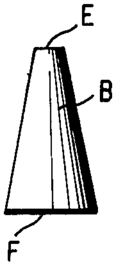
Figure 2:
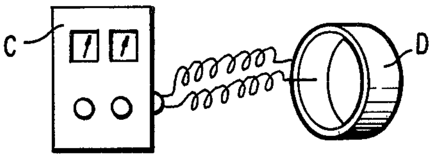
Figure 3:
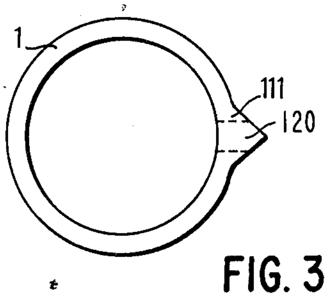
FIG. 3 is a plan view of a cylindrical ultrasonic vibratory member having a rib thereon and constructed in accordance with the ultrasonic wave generator apparatus of the present invention.
Figure 4:
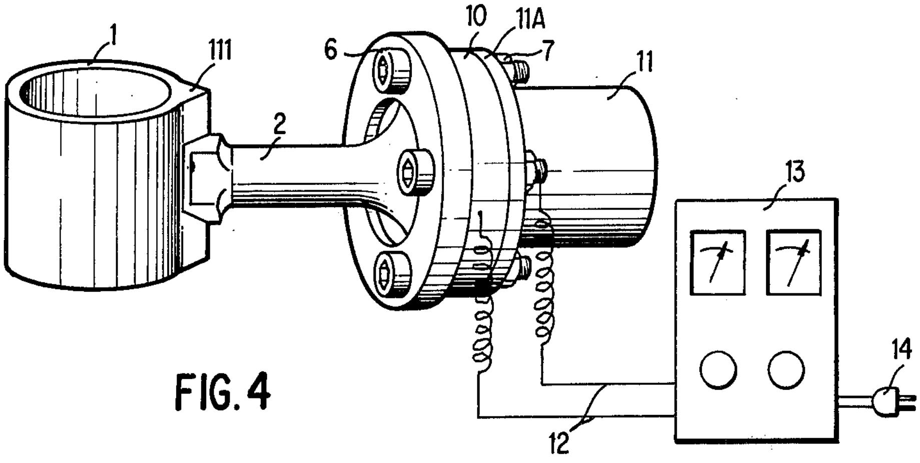
FIG. 4 is a perspective view of an ultrasonic wave generator constructed in accordance with the present invention and showing its cooperative parts.

Referring now to the drawings, and more particularly to FIGS. 3–8 thereof, a first embodiment of the present invetion, as well as the first to the third modifications thereof, will now be described. In accordance with such, an ultrasonic member 1 of a cylindrical hollow body of the ultrasonic wave generator is formed with an increased thickness portion 111, that is, a rib, having a triangular columnar projection which is integral with the cylindrical body of the vibratory member 1 and which extends in a direction parallel with the axial line thereof and over the entire axial length of the cylindrical body 1. Defined within the rib is a bore 120 for use in inserting a bolt therethrough, and the vibratory member 1 is secured by means of a bolt 3 and a wahser 4 to the mechanical-vibration output end or tip 2 of an ultrasonic vibration amplifying metal block 2, the former of which has its axial line disposed perpendicular to the vibrating direction of the metal block 2.

In this respect, the mechanical-vibration output end 2A is formed with a recessed portion adapted to engage therein the increased thickness portion of member 1 thereby permitting close contact between the side surfaces of the rib of the cylindrical, ultrasonic vibratory member and the aforenoted recessed portion of block 2. While the configuration of the rib is not limited, the same is disclosed within this embodiment as being a triangular shaped column, and this configuration of the rib does present advantages, such as for example, insurance of a positive and strong mechanical coupling between the metal block 2 and the rib 111, decreased weight of the rib, and improved rigidity within the coupling portion.

A flange 2B is formed upon the root portion of the block 2, and a plurality of bolt holes 5 are defined therein. A support 21 is fitted upon the flange 2B for reinforcing the bending rigidity thereof, and bolt holes 51 are similarly defined within ring 21, the holes 51 mating with bolt holes 5 of the flange 2B. As a result, the supporting ring 21 is integrally secured, by means of bolts 6 inserted through the holes 51 and nuts 7, to a flange 11A of the backing metal block 11 being disposed in a manner similar to that of flange 2B, flange 2B, piezoelectric elements 8A and 8B, electrode plate 9, and spacer plate 10 being sandwiched between plate 21 and flange 11A.

The piezoelectric elements 8A and 8B are disposed with the positive poles thereof facing each other, and with the electrode plate 9 interposed therebetween, the negative poles thereof being in contact with the flanges 2B and 11A. The spacer plate 10 is an annular body made of, for example, silicon rubber or the like, and is formed with holes which permit insertion of the bolts 6 therethrough while an annular inner space is defined centrally within the spacer plate 10 for housing therein the piezoelectric elements 8A and 8B and electrode plate 9. The spacer plate 10, together with elements 8A and 8B and electrode plate 9, are thus secured between the flanges 2B and 11A by means of the bolts 6 and nuts 7. The electrode plate 9 and flange 11A are connected to the electric oscillation input lead wires 12, which in turn are connected to the output side of the ultrasonic wave oscillator 13, the input side of the oscillator being connected to an electrical connector plug 14 which is of course adapted to be connected to an electric power source.

Figure 5:
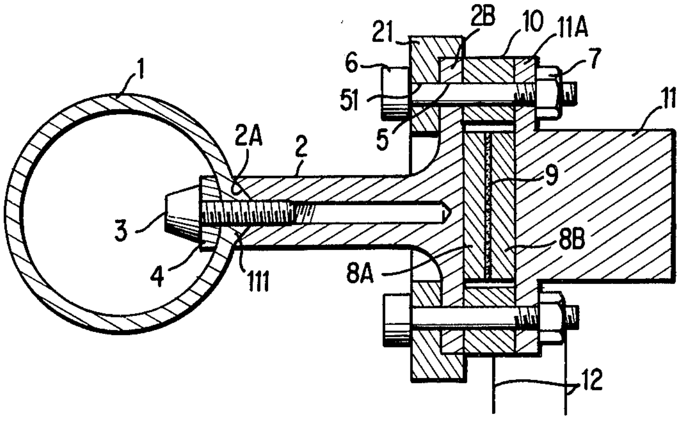
FIG. 5 is a partial, horizontal cross-sectional view of the apparatus of FIG. 4.

In this manner, the cylindrical ultrasonic vibratory member 1 having the rib 111, the ultrasonic-vibration amplifying metal block 2, piezoelectric elements 8A and 8B, and backing metal block 11, when assembled, are so designed as to cause resonance at a given frequency. In other words, the length of the ultrasonic-vibration amplifying metal block 2, extending from the mechanical vibration output end 2A to the inner end face of the flange 2B, that is, the left face of flange 2B as seen in FIG. 5 is designed to be $\frac{1}{4}$ of the wave length $\lambda$ of the ultrasonic wave to be transmitted, while the length of the backing metal block 11 is so designed such that the inner end face of the flange 2B produces anode of vibration thereon, based upon calculations and experimental data. The ultrasonic wave oscillator 13 of course imparts electric oscillations, of such a frequency so as to be adapted to cause the aforenoted resonance, to the piezoelectric elements 8A and 8B.

A description will now be given of the operation of the apparatus of the first embodiment of the present invention. When the ultrasonic wave oscillator 13 is connected to an electric power source so as to energize the same, the oscillator 13 imparts electric oscillations having the same frequency as that of the resonance frequency of an ultrasonic wave generator, to the piezoelectric elements 8A and 8B so as to cause mechanical vibration of the same. This mechanical vibration results in the longitudinal vibration of the ultrasonic wave transducer with a node of vibration being positioned at the inner end face of the flange 2B of the ultrasonic vibration amplifying metal block 2 whereby the block 2 amplifies the amplitude of vibration so that the vibrational displacement, having the amplitude thus amplified is transmitted from the mechanical-vibration output end 2A, through means of the rib 111, to the cylindrical ultrasonic vibratory member 1.

Figure 6A:
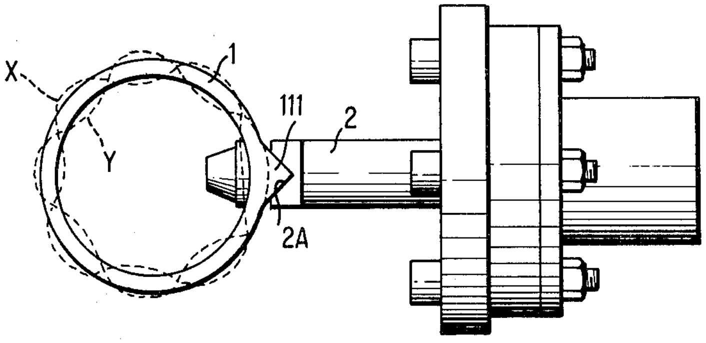
FIGS. 6(*a*) and 6(*a*) are an operational plan view and a side elevation view of the apparatus of FIG. 4, respectively.
Figure 6B:
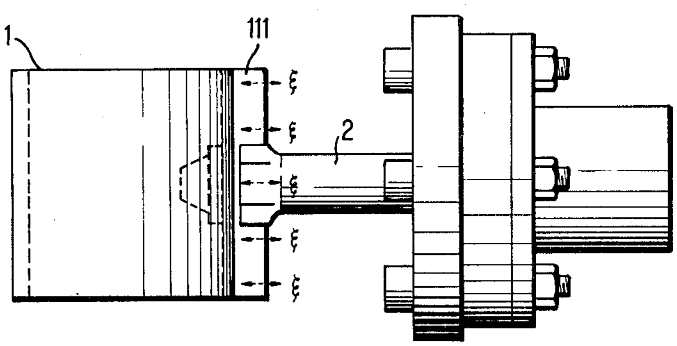

Referring now in more detail to FIGS. 6(*a*) and 6(*b*), the rib 111 assumes the form of an increased thickness portion having a columnar configuration, which portion extends over the entire axial length of the cylindrical body and presents high rigidity thereto whereby the vibrational displacements amplified by means of the ultrasonic-vibration amplifying metal block 2, and shown by chain lines $\xi$ and the accompanying arrows within FIG. 6(*b*), are distributed uniformly over the entire axial length of the rib 111.

Consequently, in accordance with this embodiment, wherein the vibratory member having the rib is so designed as to undergo the fourth order of wave-like or petaloid flexural vibration, the vibratory member is subjected to a nodal pattern, shown by the chain line X, over the entire axial length thereof, at each half cycle of vibration, and at a subsequent half cycle, the vibratory member 1 is subjected to an antinodal pattern as shown by the chain line Y. For example, if the frequency is 40 KHz, vibration is repeated at 40,000 cycles per second, and in this manner, the vibratory member 1 causes flexural vibration at a large amplitude so as to thereby generate ultrasonic waves of a large amplitude upon the inner and outer circumferential surfaces of the vibratory member.

It is thus seen that in accordance with the ultrasonic wave generator of the first modification, a rib, that is, an increased thickness portion, is added to the vibratory member 1 so as to increase the rigidity thereof thus enabling the generation of vibrations of a large amplitude for a long period of time, and further enabling the generation of ultrasonic vibrations upon a vibrating surface having a large surface area. Still further, the presence of the rib prevents fatigue failure and cracking within the joint portion of the vibratory member. Still yet further in accordance with the first modification, the ultrasonic-vibration amplifying metal block serves as a metal block of the ultrasonic wave transducer as well as functioning as a mechanical vibration amplifying portion, whereby the size of the ultrasonic generator may be rendered compact, with a consequent reduction in weight.

Furthermore, according to the first modification, the piezoelectric elements 8A and 8B are sandwiched between the flanges 2B and 11A of the ultrasonic vibration amplifying metal block 2 and the backing metal block 11, respectively, the flanges 2B and 11A having suitable resiliency and being fastened together by suitable fastening means. As a result, even if the engagement of the bolts and nuts is loosened during service of a long period of time, such a discrepancy will be compensated for by the elastic deformation of the flanges 2B and 11A so as to thereby maintain the sandwiched condition of the piezoelectric elements 8A and 8B constant, while nevertheless permitting the generation of ultrasonic waves in a consistent manner. In addition, the provision of the support ring 21 for use in reinforcing such an assembly contributes to the improvement in the stability and durability of the generator.

Figure 7:
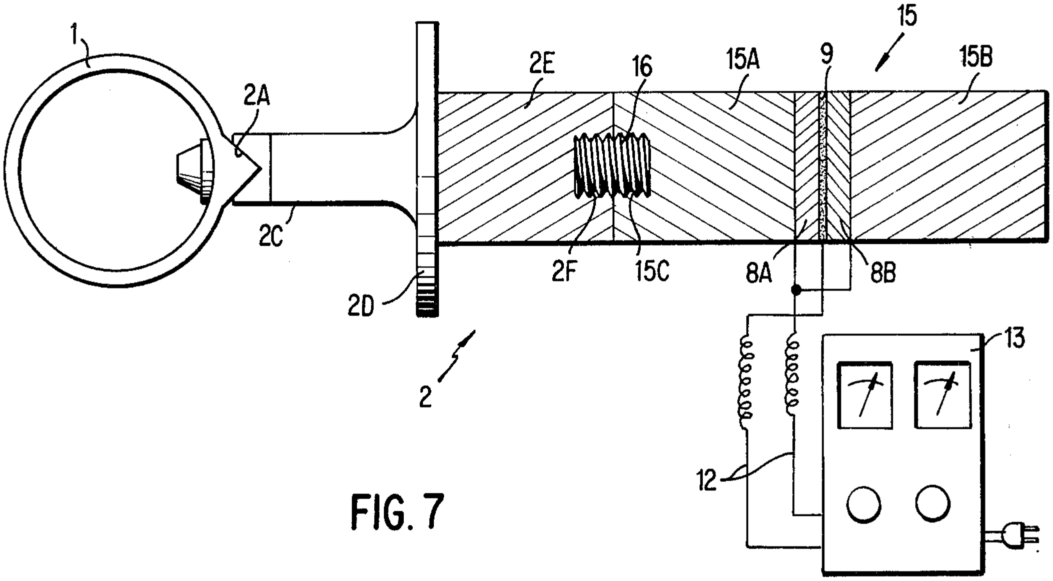
FIG. 7 is a plan view, partly in cross-section, of a second modification of the apparatus of the present invention.

A description will now be provided with respect to a second modification of the first embodiment of the present invention as shown within FIG. 7, wherein there is provided an ultrasonic-vibration amplifying metal block 2 consisting of an amplified mechanical-vibration output portion 2C, a flange portion 2D, and a mechanical-vibration input portion 2E, while the cylindrical ultrasonic vibratory member 1 is supported upon the mechanical-vibration output end 2A of block 2, which portion 2A is the tip of the mechanical-vibration output portion 2C, an ordinary ultrasonic wave transducer 15 being coupled to the end portion off the mechanical-vibration input portion 2E.

The ultrasonic wave transducer 15 transforms electrical oscillations into ultrasonic vibrations, and may be either of a piezoelectric type or of a magnetostrictive type, a piezoelectric type transducer being utilized within the present embodiment. In this respect, the piezoelectric elements 8A and 8B are disposed such that the positive poles thereof face each other, the electrode plate 9 is interposed therebetween, and the negative poles thereof are in contact with the columnar blocks 15A and 15B in an integral fashion, lead wires 12 being connected to the ultrasonic wave oscillator 13.

The ultrasonic wave transducer 15 is integrally coupled to the ultrasonic-vibration amplifying metal block 2 by means of a bolt 16 which is threadingly fitted within threaded bores 2F and 15C defined within the opposing end faces of the columnar block 15A and the mechanical-vibration input portion 2E of block 2, and in this respect, the length of the ultrasonic vibration amplifying metal block 2, extending from the end face of the flange portion 2D which is connected to portion 2C to the mechanical vibration output end 2A, is so designed as to be $\frac{1}{4}$ of the wave length $\lambda$ of the ultrasonic wave to be transmitted, while the length of the mechanical-vibration input portion 2E is so designed as to produce a node of vibration upon the end face of the flange portion 2D which is connected to portion 2C, with the end face of the mechanical-vibration input portion 2E, which is connected to transducer 15, being positioned at the crest or antinode of the wave of vibration, as based upon calculations and experimental data.

A description will now be given of the operation of the second modification of the present invention having the aforenoted structural arrangement. When the ultrasonic wave oscillator 13 is energized so as to transmit electrical oscillations to the transducer 15, the electrical oscillations are transformed into mechanical or longitudinal vibrations by means of the piezoelectric elements 8A and 8B such that the ultrasonic vibrations will be generated in such a manner that the opposite ends of the transducer 15 will be located upon the crests of the waves of vibrations.

The vibrations thus produced are then transmitted to the ultrasonic-vibration amplifying metal block 2, which in turn vibrates longitudinally so as to produce a node of vibration upon the end face of the flange portion 2D which faces portion 2C. At this time, the amplitude will be amplified by means of the mechanical-vibration output portion 2C, so that vibration having an amplitude thus amplified is transmitted from the output end 2A to the cylindrical ultrasonic vibratory member 1 having the rib thereon. As a result, the ultrasonic vibratory member 1 undergoes a wave-like or petaloid flexural vibration having a desired order, as in the case with the first modification.

Accordingly, the second modification presents a vibration of a large amplitude, for a long period of time, as well as generating ultrasonic vibrations upon a vibrating surface having a large surface area, while preventing fatigue failure and cracking within the joint portion of the vibratory member.

Figure 8:
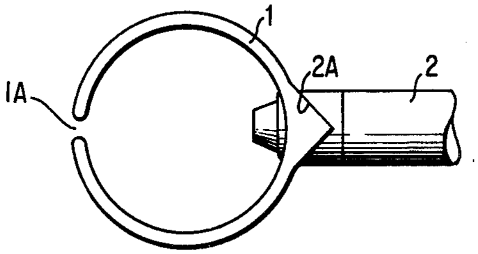
FIG. 8 is a plan view of a cylindrical, ultrasonic vibratory member, having a rib thereon, constructed in accordance with a third modification of the present invention.
Figure 9:
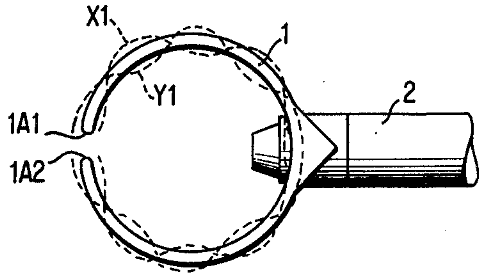
FIG. 9 is a plan view of the apparatus of FIG. 8 showing the operation of the ribbed cylindrical ultrasonic vibratory member of FIG. 8.

A third modification of the first embodiment of the present invention will now be described with reference to FIGS. 8 and 9. The third modification features an axially extending slit-like opening 1A defined within the cylindrical wall of the cylindrical ultrasonic vibratory member 1 having the rib thereon, in contrast to the aforenoted first and second modifications. As the ribbed cylindrical vibratory member 1 is open in a part thereof, the resonance frequency of the flexural vibration will be different from those of the aforenoted modifications, however, the vibrational mode thereof is such that, as shown by FIG. 9, when the vibratory member 1 undergoes the fourth order of flexural vibration, the vibratory member 1 is subjected to a vibrational mode as shown by the chain X1, at half cycle intervals, while the vibratory member 1 is also subjected to a vibrational mode of an antiphase pattern as shown by the chain line Y1 at the following cyclic periods. In this manner, each of the open ends 1A1 and 1A2 defining the opening 1A of the cylindrical body corresponds in position to a crest or antinode of the waves of vibration, and the flexural vibrating mode of the vibratory member 1 remains the same as those of the previous modifications.

Figure 10:
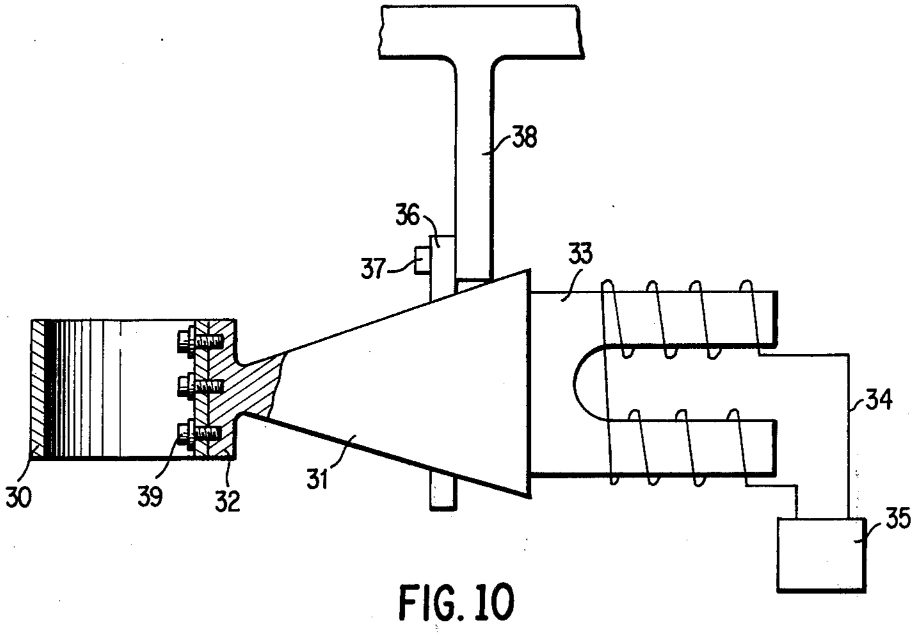
FIG. 10 is a side elevation view, partly in cross-section, of an ultrasonic wave generator constructed in accordance with a fourth modification of the present invention.
Figure 11A:
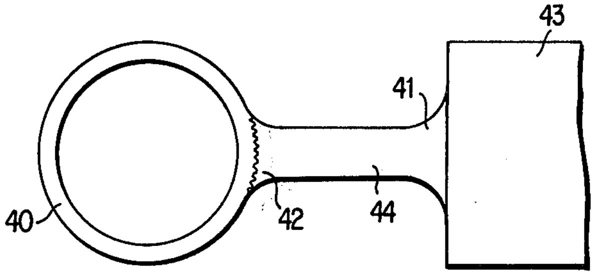
FIGS. 11(*a*) and 11(*b*) are plan, and partial cross-sectional side elevation views, respectively, illustrating the vibratory member and the mechanical vibration amplifying portion of the ultrasonic wave generator constructed in accordance with a fifth modification of the present invention.
Figure 11B:
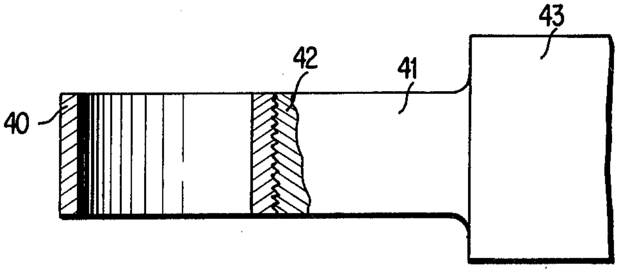

A description will now be given of a second embodiment of the present invention in conjunction with the fourth and fifth modifications of the ultrasonic wave generator, with reference being made to FIGS. 10 and 11. The ultrasonic wave generator utilized within the fourth modification is characterized by the provision of an increased thickness portion at the tip of the mechanical vibration amplifying portion, and consists of an ultrasonic wave transducer having a magnetostrictive element 33, a mechanical-vibration amplifying portion comprising a conical type horn 31 having an increased thickness portion 32 at the tip thereof, and a vibratory member of a hollow, elliptical, annular body 30 of small wall thickness.

The ultrasonic wave transducer comprises the magnetostrictive element 33 around which a lead wire 34 connected to an ultrasonic wave oscillator 35 is wound a predetermined number of times, and the mechanical vibration amplifying portion consists of the conical type horn 31 bonded to the magnetostrictive element 33. Formed upon the tip portion of the horn 31 is the increased thickness portion 32 having the same curvature as that of the elliptical vibratory member and having the same axial length as that of the vibratory member. A support plate 36 is secured to the horn 31 at a position wherein the longitudinal vibration is nullified, that is, the position of a node of vibration, and the aforenoted support plate 36 is also integrally secured to a housing 38 by means of a bolt 37.

The vibratory member 30 consists of a hollow elliptical annular body having a small wall thickness, the axial line thereof being disposed perpendicular to the axial line of the horn 31 and with the outer circumferential surface thereof secured to the increased thickness portion 32 of horn 31, which is provided at the tip of the horn, by means of three bolts 39. In other words, the vibratory member 30 is rigidly and firmly secured to the increased thickness portion of the horn having a flange-like configuration and a large surface area extending over the entire axial length of the vibratory member 30.

The fourth modification having the aforenoted arrangement may prevent stress concentration upon the joint portion of the member 30 and horn 31 by integrally securing the vibratory member 30 to the conical horn 31 through means of the increased thickness portion 32, having a large surface area extending over the entire axial length of the vibratory member 30, which is formed at the tip of the conical horn 31. In addition, the fourth modification thereby facilitates the vibration of a large amplitude for a long period of time as in the previous modifications as well as the ultrasonic vibration upon the vibrating surface of a large surface area, thus preventing fatigue failure, cracking, or the like, at the joint portion.

It is to be noted that while the fourth modification embodies a conical type horn having a circular cross section, a stepped type horn having a rectangular cross section may also be used, with an increased thickness portion thereof welded to the outer circumferential surface of the vibratory member. Accordingly, the ultrasonic wave generator of the fifth modification of the present invention features an increased thickness portion 42 which is integrally formed at the tip of a stepped type horn 41 serving as the mechanical-vibration amplifying portion which is in turn secured to an ultrasonic wave transducer, not shown. The ultrasonic wave generator has piezoelectric elements sandwiched between the two cylindrical metal blocks and secured in position by means of bolts, in accordance with the previous embodiments, and thus, only the essential portion of the fifth modification will be described hereunder in detail.

According to the fifth modification, the input portion 43 of the stepped type horn 41 is integrally secured to the aforenoted ultrasonic wave transducer by means of bolts, while the output portion 44 of the horn 41 has a rectangular cross section and a cross sectional area substantially smaller than that of the input portion 43. The tip end portion 42 of the horn 41 has an increasing cross sectional area towards the tip or end face thereof, whereby the tip end thereof smoothly engages the outer circumferential surface of the vibratory member 40, to be described.

The vibratory member 40 consists of a hollow cylinder having a small wall thickness and made of a light alloy, and which abuts the increased thickness portion 42 formed at the tip of the horn 41, the same being integrally secured together by means of, for example, brazing. The increased thickness portion 42 includes a fillet portion having a curvature such that the increased portion 42 tangentially contacts the outer circumferential surface of the vibratory member 40, and in this manner, the output portion 44 of the horn 41, having a rectangular cross section, smoothly engages the vibratory member 40.

The fifth modification having the aforenoted structural arrangement may prevent stress concentration within the joint portion of the horn and vibratory member by integrally securing the member 40 to the horn 41 through the increased thickness portion 42 having the fillet portion thereof and the large joint area created thereby, which portion 42 is formed at the tip of the output portion 44 of the horn 41. As a result, the fifth modification enables ultrasonic vibration of a large amplitude for a long period of time as well as ultrasonic vibration upon a vibrating surface of a large surface area thus preventing fatigue failure and cracking within the aforenoted joint portion.

Figure 12A:
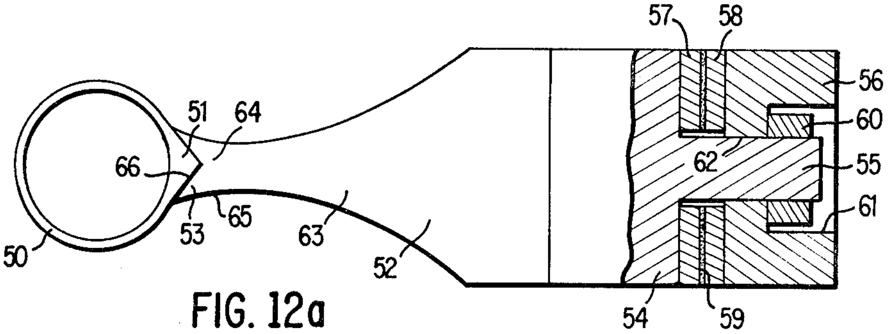
FIGS. 12(*a*) and 12(*b*) are views similar to those of FIGS. 11(*a*) and 11(*b*) illustrating the ultrasonic wave generator of a sixth modification of the present invention.
Figure 12B:
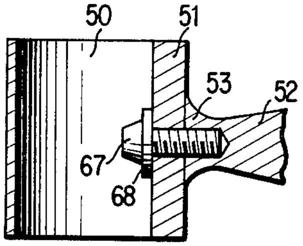

A third embodiment of the present invention will now be described, with reference also being made to a sixth modification, as shown within FIGS. 12(*a*) and 12(*b*). The ultrasonic wave generator disclosed as the sixth modification features the provision of increased thickness portions which are formed upon the vibratory member of a hollow cylindrical body as well as upon the mechanical-vibration amplifying portion.

The ultrasonic wave transducer comprises a first metal block 54 of a solid cylindrical body having a T-shaped cross section, and a second metal block 56 of a cylindrical body, which has an axial, stepped opening therethrough which includes an opening 62 within the left end portion thereof. The aforenoted opening 62 has a diameter slightly larger than that of a small diameter portion 55 of the metal block 54 and is coaxial therewith, and the inner diameter of the metal block 56, defining opening 61, is slightly larger than the outer diameter of a nut 60 which is secured upon a threaded portion provided upon the small diameter portion 55 of the metal block 54. The annular piezoelectric elements 57 and 58 and electrode plate 59 are secured between the metal blocks 54 and 56 by means of the nut 60, the piezoelectric elements 57 and 58 being connected to the ultrasonic wave oscillator, not shown.

The mechanical-vibration amplifying portion comprises a catenary type horn 52, the root portion thereof having a large diameter and constituting the input portion which is integrally secured to the metal block 54 of the ultrasonic wave transducer by means of suitable bonding means. The vibration amplifying portion 63 constituting a rib structure of an output portion is fomred so as to have a predetermined radius of curvature, and the horn 52 is integrally secured to a support plate, not shown at the nodal position of vibration.

The vibratory member 50 comprises a hollow cylinder having a small wall thickness and formed with an increased thickness portion 51 which projects from the outer circumferential surface of the vibratory member 50 such that the side surfaces of the portion 51 are defined by two intersecting tangential lines extending from predetermined positions located upon the outer circumferential surface of the vibratory member 50, the aforenoted increased thickness portion 51 extending over the entire axial length of the vibratory member 50.

The side walls 65 of the tip portion 64 of the vibration amplifying portion 63 of the horn 52 are also formed with an increased thickness portion having a smooth radius of curvature such that the increased thickness portion tangentially contacts the circumferential surface of the vibratory member 50. The tip portion 66 thereof which engages the vibratory member 50 is formed with a recessed portion having a configuration which accomodates the projecting increased thickness portion 51 of the vibratory member 50. The vibratory member 50 is secured to the catenary horn 52 by means of a bolt 67 and a washer 68, as shown within FIG. 12(*b*), with its axial line being disposed perpendicular to the axial line of the horn, it being noted that for clarification of the construction of the increased thickness portion, bolt 67 and washer 68 are not shown within FIG. 12(*a*).

The sixth modification having the aforenoted arrangement may increase the bending rigidity of member 50 by the provision of the projecting increased thickness portion 51 at the joint portion of the vibratory member 50 with horn 52, such preventing stress concentration thereon by providing a joint portion of large area, the same comprising in fact a rigid and strong joint portion due to the increased mechanical strength of the increased thickness portion 51. The sixth modification further prevents stress concentration upon the tip portion of the horn because of the increased thickness portion having the smoothly curved fillet portion provided upon the tip portion 64 of the horn 52, and accordingly, the sixth modification may prevent fatigue failure and cracking within the joint portion when used for a long period of time due to such increased joint strength above and beyond that of the previous modifications. Accordingly, the sixth modification permits the use of a vibratory member of a larger size and enables the generation of ultrasonic waves upon the vibrating surface having a larger surface area.

Figure 13:
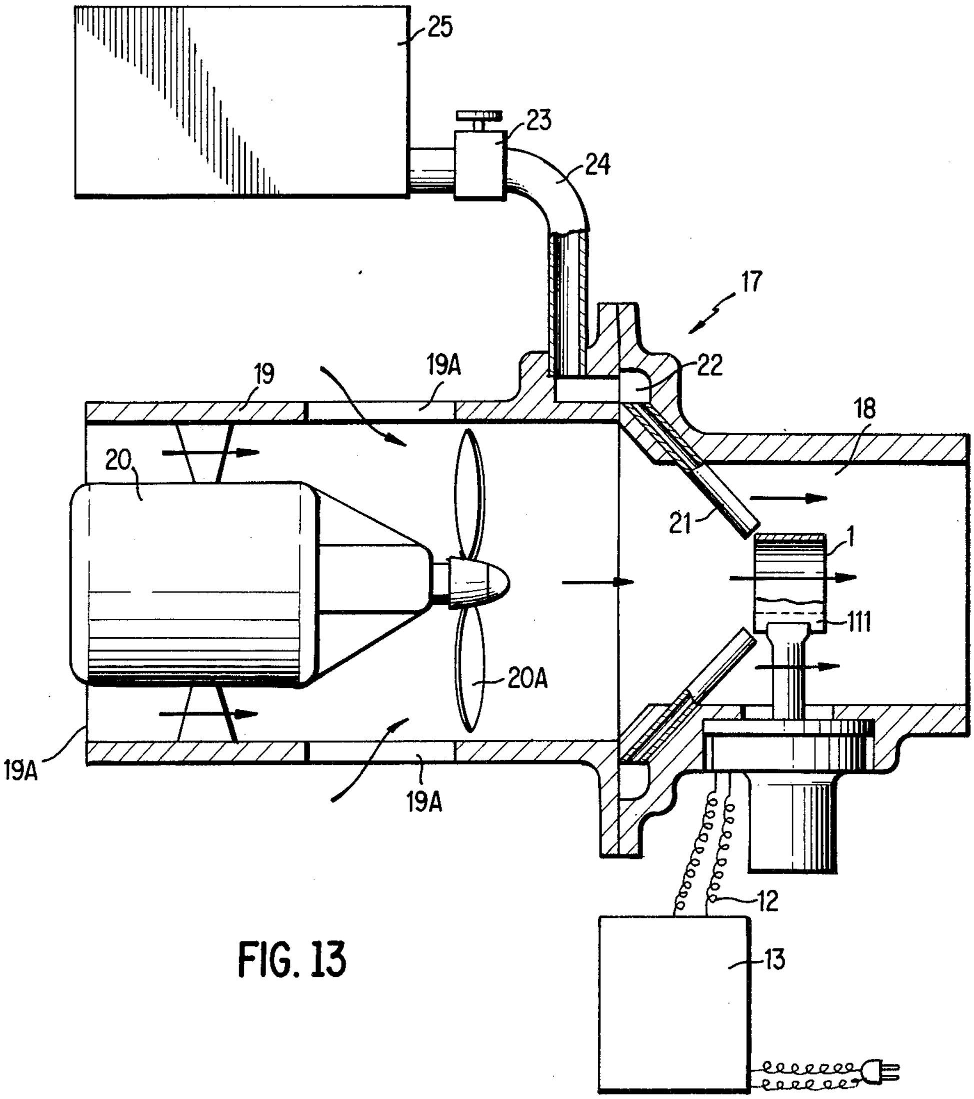
FIG. 13 is a side elevation view, partly in cross-section, of the application of the ultrasonic wave generator constructed in accordance with the modification of FIG. 4 of the present invention to a humidifier apparatus system.

A description will now be given of an ultrasonic wave generator constructed in accordance with the present invention, which is adapted for use with a water atomizing chamber of a humidifier, as seen within FIG. 13. Mounted upon the undersurface of a water atomizing chamber 18 of a humidifier generally indicated by the reference character 17, is an ultrasonic wave oscillator 13, while a cylindrical ultrasonic vibratory member 1, having a rib, that is, an increased thickness portion 111, projects radially into the water atomizing chamber 18, with the axial line thereof in coincidence with that of the water atomizing chamber 18.

One end of the water atomizing chamber 18 is open while the other end thereof is in communication with the exit of a blower cylinder 19. Disposed within the blower cylinder 19 is a motor 20 provided with a fan 20A, and air intake ports 19A are defined within the entrance end and side wall surfaces of the cylinder 19. In addition, water supply pipes 21, of a small diameter, project into the water atomizing chamber 18 in such a manner as to face the end face of the ribbed cylindrical, ultrasonic vibratory member 1 upon the side thereof facing the blower cylinder 19.

The water supply pipes 21 are in fluidic communication with an annular water chamber 22 defined within the outer circumferential surface of the water atomizing chamber 18 and the blower cylinder 19, and the water chamber 22 is in turn in communication with a water reservoir 25, disposed above chamber 22, through means of a conduit 24 having a cock valve 23 therein. Accordingly, water within water reservoir 25 is supplied by means of the water supply pipes 21 to the surface of the ribbed cylindrical ultrasonic vibratory member 1. Lead wires 12 extend from the ultrasonic wave oscillator 13. Operation of the aforenoted humidifier 17 will now be described.

When the ultrasonic wave oscillator 13 is energized, the ribbed cylindrical, ultrasonic vibratory member 1 is vibrated with a large amplitude. The motor 20 is then driven so as to introduce air through the air intake ports 19A, which then proceeds from the blower cylinder 19 towards the water atomizing chamber 18, while the cock 23 is opened so as to feed water from the water reservoir 25 through means of conduit 24 to water chamber 22 and from the tips of the water supply pipes 21 to the vibratory member 1.

The water supplied to the vibratory member 1 is spread over the inner and outer circumferential surfaces of the vibratory member so as to form water films thereon, whereupon the water films are subsequently divided into groups of minute water particles due to the ultrasonic vibration thereof, following which sprinkling and atomization occur. The water thus atomized is entrained within the air stream from the fan 20A and discharged through the open end of the atomizing chamber 18 to atmosphere so as to add moisture thereto. In this case, since the vibratory area of the vibratory member 1 is extremely large, there may be achieved atomization of a large amount of water per unit of time.

In addition, owing to an increase in the rigidity of the vibratory member due to the provision of the rib 111, the vibratory member presents a uniform distribution of the vibratory amplitude, at the same level, along the axial direction of the vibratory member thereby enabling uniform atomization. In addition, the vibratory member is increased in strength thereby insuring its service for a long period of time, and also prevents fatigue failure and cracking, thus resulting in an extensive service life of the humidifier as well.

The second aspect of the present invention may be practiced in accordance with the fourth and fifth embodiments which will be described hereinafter, while various modifications and alterations may be effected and the second aspect of the present invention will now be described with reference to the fourth embodiment. The feature of the fourth embodiment lies in that the mechanical vibration amplifying portion, the joint portion, the amplitude amplifying portion, and the vibratory member of a hollow cylindrical body are integrally formed, that is, the ultrasonic vibratory member and the mechanical vibration amplifying member form one member.

The fourth embodiment represents an ultrasonic wave generator within which an ultrasonic vibration amplifying block, that is, a mechanical vibration amplifying portion coupled to an ultrasonic wave transducer consisting of a magnetostrictive element or piezoelectric elements connected to an ultrasonic wave oscillator, consists of a joint portion, an amplitude amplifying portion, and a hollow cylindrical body integrally coupled to the tip of the amplitude amplifying portion.

Stated otherwise, the mechanical vibration amplifying portion, that is, the ultrasonic vibration amplifying block, consists generally of a joint portion to be integral with an ultrasonic wave transducer, an amplitude amplifying portion having a cross sectional area which is decreased towards the tip thereof in the axial direction and coupled to the joint portion, and a hollow cylindrical body integrally coupled to the tip of the amplitude amplifying portion with its axis being disposed perpendicular to the amplitude amplifying portion, the aforenoted hollow cylindrical portion having openings at its axially opposite ends.

The ultrasonic wave generator of the fourth embodiment having the aforenoted arrangement transforms electrical oscillations into mechanical vibrations by means of the aforenoted ultrasonic wave transducer, amplifies the amplitude of the mechanical vibration by means of an amplitude amplifying portion, that is, an ultrasonic vibration amplifying block, and then transmits the vibratory displacement of the amplitude thus amplified to the circumferential surfaces of a hollow cylindrical body so as to thereby subject the same to vibrations of a large amplitude in the radial direction, or to a wave-like or petaloid flexural vibration, thereby generating ultrasonic waves from the inner and outer circumferential surfaces of the cylindrical body.

The inner and outer diameters of the vibratory member of a hollow cylindrical body should be so determined as to cause resonance in accordance with the frequency of the electrical oscillations being imparted to the ultrasonic wave transducer, however, while the above dimensions are dependent upon two factors, that is, the frequency and the order of flexural vibration, the dimensions may be changed without being seriously limited. As a result, an ultrasonic wave having a large amplitude may be effectively generated from the extensive surface areas of the inner and outer circumferential surfaces of the vibratory member, without a limitation in the size of the vibratory member, while retaining the aforenoted functions and advantages of the present invention.

A description will now be given of the fifth embodiment of the present invention in accordance with which, the features reside in that a vibratory member of a hollow cylindrical body is integrally formed with the tip portion or an amplitude amplifying portion, and subsequently, a joint portion is integrally formed between a base or rear end portion of the amplitude amplifying portion and a transducer, after which the aforenoted components, thus separately prepared, are integrally coupled to each other by means of a bolt, welding or the like. That is, one member, having integrally secured thereto an ultrasonic vibratory member is in turn integrally secured to another member, having one end thereof integrally secured to an ultrasonic wave transducer, by securing means whereby the ultrasonic vibratory member and the mechanical vibration amplifying member are integrally formed as one body.

According to the fifth embodiment of the invention, a rear end portion of an amplitude amplifying portion is coupled to an ultrasonic vibration amplifying block, that is, a mechanical vibration amplifying portion is coupled to an ultrasonic wave transducer consisting of either a piezoelectric or a magnetostrictive element, and the tip portion of the amplitude amplifying portion is integral with a vibratory member of a hollow cylindrical body, and such coupled components are secured together by means of a bolt, welding, brazing or the like, so that the mechanical vibration amplifying portion may be integrally formed thereby presenting an ultrasonic wave generator as in the fourth embodiment.

The ultrasonic wave generator of the fifth embodiment transforms electrical oscillations from an ultrasonic wave oscillator into mechanical vibrations by means of the ultrasonic wave transducer, then amplifies the amplitude of the mechanical vibrations, thus transformed, by means of an amplitude amplifying portion, that is, an ultrasonic wave amplifying block having the aforenoted arrangement, and ultimately transmits a vibratory displacement of an amplitude thus amplified to the circumferential surfaces of the vibratory member of a hollow cylindrical body so as to subject the circumferential surfaces of the vibratory member to vibration or flexural vibration of a large amplitude in the radial direction, thus generating ultrasonic waves from the inner and outer circumferential surfaces of the cylindrical body.

The ultrasonic wave generator of the fifth embodiment having the aforenoted arrangement is similar in function to that of the fourth embodiment and thus readily achieves the functions and advantages of the present invention. In addition, the portions which are integrally formed are simple in construction, as compared with that of the fourth embodiment, so that the manufacture of the ultrasonic wave generator is considerably simplified, with the accompanying advantages in saving manufacturing costs.

In case the ultrasonic wave generator of the fifth embodiment is used as a liquid emulsifying or mixing device, and therefore the ultrasonic wave generating portion, that is, the hollow cylindrical portion, is subjected to wear, the ultrasonic wave generating portion may be readily replaced, thereby presenting many advantages for practical applications.

Considering now the fourth embodiment, and the seventh to ninth modifications thereof as shown within FIGS. 17–20, the ultrasonic wave generator according to the seventh modification comprises a mechanical vibration amplifying member 202 integrally including a joint portion, an amplitude amplifying portion which is integrally coupled to the joint portion, an ultrasonic wave vibratory member 201 of a hollow cylinder which is coupled to the tip of the vibration amplifying portion, and a magnetostrictive type ultrasonic wave transducer 204 connected to an ultrasonic wave oscillator 203 for transforming electrical oscillations into mechanical vibrations. The magnetostrictive ultrasonic wave transducer 204 consists of a magnetostrictive element 206 upon which a lead wire 205 is wound around the U-shaped member 206 a predetermined number of times, the aforenoted lead wire 205 being connected to the ultrasonic wave oscillator 203.

The mechanical vibration amplifying portion 202 comprises a conical type horn of a conical member, and integrally coupled to the mechanical vibration output end thereof at the small diameter end portion of the conical member, which is the tip portion of the horn, and which constitutes a joint portion, is a vibratory member of a hollow cylindrical body, to be described later. The aforenoted magnetostrictive element 206 is bonded to the mechanical vibration input end 202A of the horn 202 at the large diameter end portion of the conical member which input end 202A constitutes another joint portion thereof.

A support plate 207 is secured at a nodal position, wherein the longitudinal vibration becomes zero, to the surface of the horn 202, with the aforenoted support plate being in turn secured to a supporting member, not shown, whereby the horn is rigidly supported in position. The vibratory member 201 is a hollow cylindrical body having a small wall thickness and with its axial line being disposed perpendicular to the axial line of the horn 202 of the conical member, the outer circumferential surface of the vibratory member being combined with the tip surface of the horn by means of a smooth curvature portion. In this respect, the dimensions of the vibratory member and the horn are so designed as to cause resonance with the frequency of electrical oscillations being fed to the aforenoted magnetostrictive element.

A description will now be given of the operation of the seventh modification. The electrical oscillations having a frequency the same as a resonance frequency of the ultrasonic wave generator are fed to the magnetostrictive type ultrasonic wave transducer 204 from the ultrasonic wave oscillator 203 so as to thereby produce mechanical vibrations therefrom. The amplitude of the mechanical vibrations is amplified within the amplitude amplifying portion of the mechanical vibration amplifying member 202 and subsequently, a vibratory displacement of the amplitude thus amplified is transmitted to the ultrasonic wave vibratory member 201 of the hollow cylindrical body having a large vibratory surface area. As a result, the vibratory member vibrates with a large amplitude, thereby generating an ultrasonic wave of a large amplitude.

Figure 18:
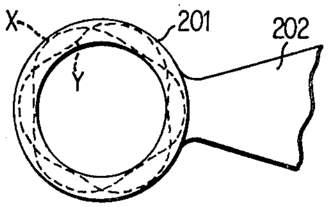
FIG. 18 is a plan view illustrative of the operation of the apparatus of the modification of FIGS. 17(*a*) and 17(*b*)
Figure 19A:
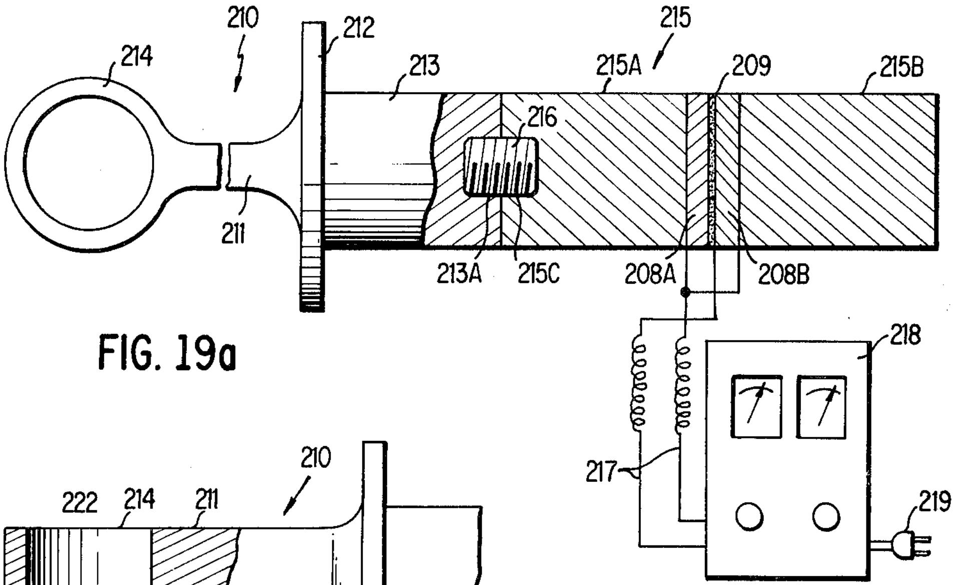
FIGS. 19(*a*) and 19(*b*) are plan and partial side elevation views illustrative of an eighth modification of the present invention, with parts thereof shown in cross-section.
Figure 19B:
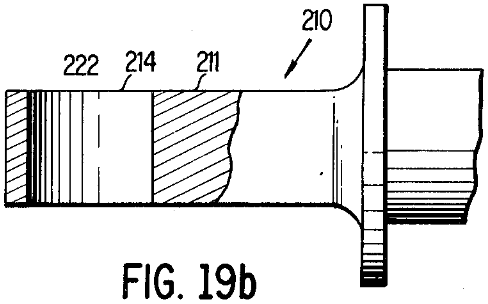

More particularly, the description will proceed with the case wherein the vibratory member is subjected to the third order flexural vibration, by referring, for example, to FIG. 18. The vibratory member is subjected to the vibrations as schematically shown by the chain line X at half cycle intervals of the vibration, and is also subjected to anti-phase vibrations as shown by the chain line Y, at succeeding half cycles intervals. In the case of 40 KHz, the aforenoted cycle is repeated 40,000 cycles per second, and in this manner, the vibratory member 201 is subjected to a wave-like or petaloid flexural vibration of large amplitude, thereby generating ultrasonic waves of large amplitude from the inner and outer circumferential surfaces thereof.

As is clear from the foregoing, the ultrasonic wave generator of the fourth embodiment generates ultrasonic waves from the inner and outer circumferential surfaces of the vibratory member, that is, the vibrating surface of a large surface area. Furthermore, due to the integral provision of the vibratory member at the tip of the output portion of the mechanical vibration amplifying member, the mechanical strength of the joint portion defined between the vibratory member and the mechanical vibration output end of member 202 is increased, and steady or smooth transmission of ultrasonic waves to the vibratory member permits generation of ultrasonic waves in a stable manner for a long period of time. Still further, even if the vibratory member is subjected to vibration for a long period of time, there may be prevented fatigue failure and cracking within the joint portion.

Turning now to consideration of the fourth embodiment, and more particularly to the eighth modification of the present invention, as shown in FIGS. 9(*a*) and 9(*b*), the ultrasonic wave generator of this modification features an integral formation of a vibratory member 214 coupled to the tip of a mechanical vibration amplifying member, generally indicated by the reference character 210 and comprising a stepped type horn having a mechanical vibration output portion 211 of a transverse rectangular cross section, the aforenoted vibratory member 214 having a length which is substantially the same as the longer side of the rectangular cross section of the aforenoted output portion 211.

In accordance with the eighth modification, the mechanical vibration amplifying portion 210 integrally comprises the mechanical vibration output portion 211, a flange portion 212, and a mechanical vibration input portion 213, output portion 211 including a connecting portion having an increased thickness portion tangentially contacting the outer circumferential surface of a vibratory member 214 of a hollow cylindrical body. An ultrasonic wave transducer 215 is integrally coupled to the end face of the mechanical vibration input portion 213, and the ultrasonic wave transducer 215 transforms electrical oscillations into ultrasonic vibrations, and while the transducer may be either of the piezoelectric type or of the magnetostrictive type, within this modification, the piezoelectric type transducer is used. In this respect, the piezoelectric elements 208A and 208B have their positive poles facing each other and an electrode plate 209 interposed therebetween with the negative poles in integral contact with columnar blocks 215A and 215B, respectively. Lead wires 217 are connected to the ultrasonic wave oscillator 218 as well as to the elements 208A and 208B.

The ultrasonic wave transducer 215 is integrally secured to the mechanical vibration amplifying member 210 by means of a bolt 216 threadedly engaged within threaded bores 215C and 213A defined within the opposing faces of the columnar block 215A and the columnar block 213 constituting the mechanical vibration input portion, respectively.

The mechanical vibration amplifying portion 210 is seen to include the flange portion 212 having a large diameter than that of block 213 and which is secured to the columnar block 213 so as to constitute a joint portion therewith. The amplitude amplifying portion 211 of rectangular cross-section has its thickness initially sharply decreased along both the shorter side of the rectangular cross section and the longer side thereof in the direction extending towards the tip thereof and in the axial direction as compared with that of the flange portion 212, and subsequently, the thickness remains substantially unchanged except as the portion 211 approaches the member 214 wherein the transverse width thereof is again increased.

The hollow cylindrical body 214 is secured to the tip of the amplitude amplifying portion 211, and the outer circumferential surface of the hollow cylindrical body 214 is secured to the end wall of the amplitude amplifying portion 211 at the tip thereof and in a tangential fashion, the length or height of the hollow cylindrical body 214 being equal in dimension to that of the amplitude amplifying portion 211.

In this respect, the length of the mechanical vibration amplifying portion is ½ of the wave length λ of an ultrasonic wave to be transmitted, and the length of the mechanical vibration input portion 213 is so determined, according to calculations or experimental data, that the end face of the flange portion 212 corresponds to a node of vibration while the end face of the mechanical vibration input portion 213 corresponds to an antinode or crest of the vibration.

A description will now be given of the operation of the eighth modification. When the ultrasonic wave oscillator 218 is energized so as to provide electrical oscillations to the transducer 215, the electrical oscillations are subsequently transformed into mechanical or longitudinal vibrations by means of the piezoelectric elements 208A and 208B, so that an ultrasonic wave, having its crests positioned at the opposite ends of the transducer 215, is generated.

This vibration is in turn transmitted to the mechanical vibration amplifying portion 210, while the mechanical vibration amplifying portion 210 is also subjected to longitudinal vibration, with the node of the vibration positioned at the end face of the flange portion 212, and at this time, the amplitude of vibration is amplified by means of the mechanical vibration output portion 211, whereupon the vibration of an amplitude thus amplified is then transmitted to the ultrasonic wave vibratory member 214. The vibratory member 214 will in turn be subjected to flexural vibration of a required order as in the case of the seventh modification.

Accordingly, the eighth modification generates an ultrasonic wave from the vibrating surfaces of a large surface area as in the case with the seventh modification, while increasing the mechanical strength of the joint portion of the vibratory member due to the fact that the axial length of the hollow cylindrical body is substantially equal to the length of the longer side of the rectangular cross section of the aforenoted output portion. In addition, an ultrasonic wave having an amplified amplitude may be uniformly transmitted over the entire length of the vibratory member whereby an ultrasonic wave may be generated in a further stabilized manner for a long period of time, and fatigue failure and cracking may be prevented within the joint portion of the vibratory member.

Proceeding further, a description will now be given of the fourth embodiment with particular reference to the ninth modification of the present invention as shown within FIGS. 20(*a*) and 20(*b*). The ultrasonic wave generator of this modification includes an increased thickness portion, that is, a rib 222A of a vibratory member 222, which is provided at the connecting portion defined between the tip of a metal block 221 and the vibratory member 222 of a hollow cylindrical body, and an increased thickness portion likewise provided at the connecting portion of the amplitude amplifying portion for contacting the outer circumferential surface of the hollow cylinder, the aforenoted metal block 221 being a stepped horn secured to an ultrasonic wave transducer generally indicated by the reference character 220. Thus, the aforenoted rib 22A integrally interconnects both members thereby increasing the strength of the connecting portion.

Figure 20A:
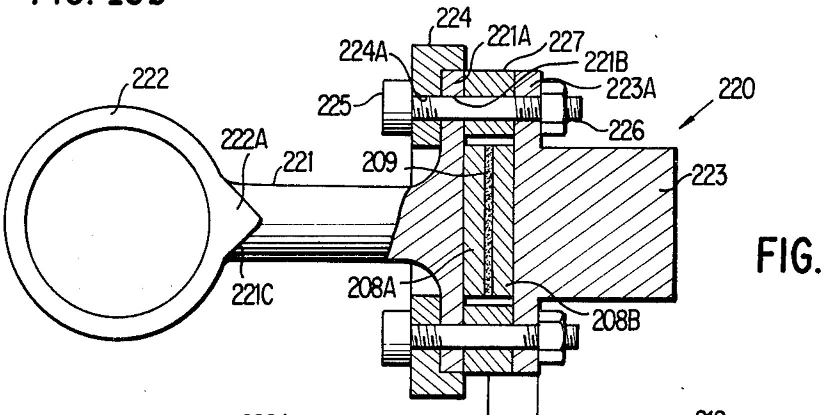
FIGS. 20(*a*) and 20(*b*) are views similar to those of FIGS. 19(*a*) and 19(*b*), illustrative however of a ninth modification of the present invention.
Figure 20A:
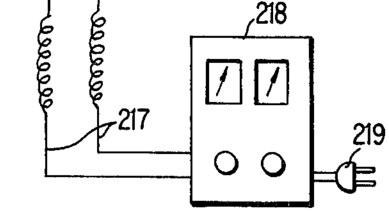
Figure 20B:
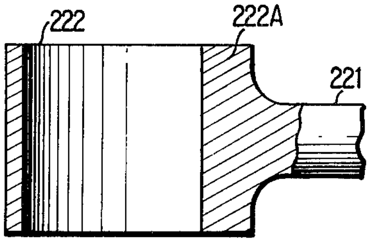
Figure 21A:
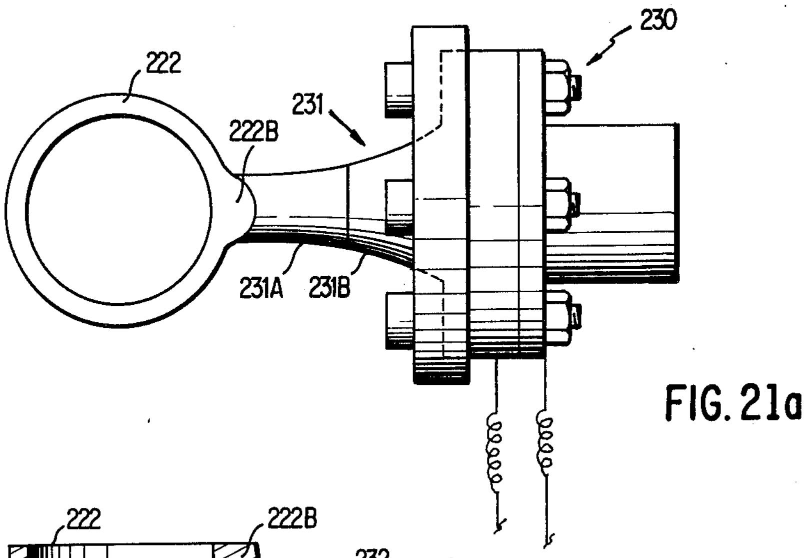
FIGS. 21(*a*) and 21(*b*) are views similar to those of FIGS. 19(*a*) and 19(*b*), showing however, a tenth modification of the present invention.
Figure 21B:
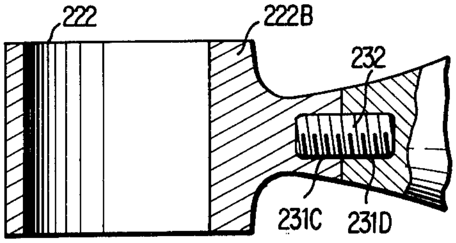

The vibratory member 222 of a hollow cylindrical body is connected to the tip portion of the ultrasonic wave-vibration-amplifying metal block 221 serving as an amplitude amplifying portion of the mechanical vibration amplifying portion, with its axial line being disposed perpendicular to the axial line of the metal block 221, and the increased thickness portion is in the form of a triangular projection, that is, the rib 222A is formed at the connecting portion therebetween, the aforenoted projection extending along a line parallel with the longitudinal axis of the aforenoted cylindrical body, as shown within FIG. 20(*a*). In this respect, the rib 222A, and the increased thickness portion thereof, serve to increase the bending rigidity of the aforenoted connecting portion, and it is to be noted that the configuration of the rib is by no means to be limited to that shown herein, and thus various modifications may be effected with respect to the shapes and dimensions thereof.

Formed upon the base portion of the block 221 is a flange 221A which also serves as a joint portion, and the flange 221A has a plurality of bolt bores 221B which are equally spaced along the circumferential extent thereof. An annular support ring 224 also serves to reinforce the bending rigidity of the flange 221A, and bores 224A, for mating with the bolt bores 221B defined within the flange 221a, are likewise defined within the annular support ring 224 whereby the flange 221A may be coupled to an opposing flange 223A of a backing metal block 223 with the piezo-electric elements 208A and 208B, constituting an ultrasonic wave transducer, an electrode plate 209, and a spacer plate 227 being interposed therebetween.

The piezoelectric elements 208A and 208B have their positive poles facing each other, with the electrode plate 209 interposed therebetween, and have their negative poles in contact with the flanges 221A and 223A, respectively. The spacer plate 227 is an annular body made of, for example, silicon rubber and formed with bores permitting insertion of bolts 225 therethrough, the aforenoted spacer plate 227 also having an internal cavity which houses the piezo-electric elements 208A and 208B and the electrode plate 209 therein, which assembly is secured between the flanges 221A by means of bolts 225 and nuts 226.

Connected to the electrode plate 209 and flange 223A are electrical oscillation input lead wires 217, which are of course also connected to the output terminal of the ultrasonic wave oscillator 218, the input side of the oscillator 218 being connected to an electrical connector plug 219 which in turn is connected to an electric power source, not shown.

In this respect, the vibratory member 222, ultrasonic vibration amplifying metal block 221, piezoelectric elements 208A and 208B, and backing metal block 223 are so formed as to cause resonance at a given frequency. More particularly, the length of the ultrasonic vibration amplifying metal block 221 is predetermined such that the end face of the aforenoted flange 221A will be positioned at a node of vibration, according to calculations or experimental data, the ultrasonic wave oscillator 218 of course transmitting electrical oscillations, having a resonance frequency, to the piezoelectric elements 208A and 208B.

A description will now be disclosed of the operation of the ninth modification. When the ultrasonic wave oscillator 218 is connected to the electric power source and energized thereby, the oscillator 218 transmits electrical oscillations of the same frequency as that of the resonance frequency of the ultrasonic wave generator to the piezoelectric elements 208A and 208B thereby causing mechanical vibration thereof. This mechanical vibration vibrates the ultrasonic wave transducer 220 with a node of vibration being disposed at the end face of the flange 221A, whereupon the block 221 amplifies the amplitude of vibration after which the vibratory displacement of an amplitude thus amplified is transmitted from the mechanical vibration output end 221C to the vibratory member 222. Accordingly, the vibratory member 222 generates a wave-like or petaloid flexural vibration of a large amplitude as in the case with the preceding modification, thereby generating an ultrasonic wave from the inner and outer circumferential surfaces thereof.

According to the ninth modification then, increased thickness portions, that is, ribs, are provided at the connecting portion between the vibratory member and the tip of the ultrasonic-vibration-amplifying metal block, both of which are integrally coupled together, whereby the bending rigidity of the joint portion of the vibratory member is increased to an extent further than that of the case of the preceding modification. This then permits uniform transmission of the vibratory displacement of a large amplitude to the cylindrical body over its entire length, with the result of ultrasonic vibrations of a large amplitude being generated from the vibratory member of a larger size. In addition, with this modification, even in the case of a large size vibratory member, there is no possibility of a foreign vibratory mode being introduced due to the reinforcement of the aforenoted increased thickness portion, and consequently, there is achieved an extremely stable flexural vibration without abnormal vibratory stress within the vibratory member.

Accordingly, the ultrasonic wave generator of the ninth modification enables vibration at a large amplitude for a long period of time, as in the preceding modification, as well as ultrasonic vibration from the vibrating surfaces of a large surface area of the vibratory member, thereby preventing fatigue failure and cracking at the joint portion. In addition, according to the ninth modification, the ultrasonic-vibration amplifying metal block serves as a metal block for the ultrasonic wave transducer as well as functioning as a mechanical vibration amplifying portion, and consequently, the size of the generator may be rendered compact and light in weight.

Still further, in accordance with the ninth modification, the ultrasonic vibration amplifying metal block 221 is secured to the backing metal block 223, with the piezoelectric elements 208A and 208B interposed between the elastic flanges 221A and 223A of the aforenoted metal blocks 221 and 223, so that even in case the bolt and nut fastening assembly becomes loosened due to their service for a long period of time, the aforenoted looseness may be compensated for due to the elastic deformation of the flanges 221A and 223A thereby maintaining the sandwiched condition of the piezoelectric elements 208A and 208B in a consistent manner whereby an ultrasonic wave may be generated in a stable manner. In addition, the provision of the supporting ring 224, which is provided for reinforcing purposes, may enhance the stability and durability of the generator.

Referring now to FIGS. 21–25, the fifth embodiment of the present invention including the tenth to twelfth modifications, will be described wherein, within the fifth embodiment, one member comprising the ultrasonic vibratory member and the output portion of the mechanical vibration amplifying member is secured to another member comprising the input portion of the mechanical vibration amplifying member by means interposed therebetween.

Unlike the ultrasonic wave generator according to the ninth modification, the ultrasonic wave generator according to the tenth modification is of such an arrangement that one member comprises a vibratory member of a hollow cylinder and the tip portion of an amplitude amplifying portion of a mechanical vibration amplifying portion, while a joint portion is integrally coupled to another member which is a base or end portion of the aforenoted amplitude amplifying portion by fastening means, such as, for example, a bolt. More specifically, according to the tenth modification, an ultrasonic vibration amplifying portion 231 of an exponential type horn consists of two components 231A and 231B as the one and another member, the aforenoted horn being formed so as to have an exponentially shaped member having a circumferential surface of a given radius of curvature.

The aforenoted vibratory member 222 is integrally formed with the tip portion 231A of the amplitude amplifying portion of the ultrasonic-wave-amplifying block generally indicated by the reference character 231, while an increased thickness portion, that is, a rib 222B is formed on the connecting portion between the vibratory member 222 and the amplitude amplifying portion, the aforenoted rib 222B consisting of a projection having a semi-circular cross section and extending along a line parallel with the longitudinal axis of the cylindrical body, the increased thickness portion or rib being formed at the connecting portion so as to tangentially contact the outer circumferential surface of the hollow cylinder.

The tip portion 231A of the amplitude amplifying portion is in turn integrally coupled to the rear end portion 231B of the amplitude amplifying portion by means of threaded bores 231C and 231D defined within the opposing end faces of the rear end portion 231B and tip portion 231A and by means of a bolt 232 disposed therein, and thus, according to the tenth modification, the tip portion and rear end portions of the amplitude amplifying portion are integrally coupled together thereby constituting an amplitude amplifying portion. The other arrangement and functions of this modification remain unchanged as compared with that of the preceding ninth modification, and accordingly, the tenth modification functions similarly to the ninth modification, thereby achieving the functions and advantages of the present invention.

In addition, the shape of the integrally formed portion is simple, as compared with that of the fourth embodiment, so that manufacture of the ultrasonic wave generator may be accomplished in a simple manner thereby reducing manfacturing costs, and furthermore, the ultrasonic wave generator of the fifth embodiment is particularly well adapted for use as a liquid emulsifying and mixing device, within which the generating portion of an ultrasonic wave is liable to undergo wear, because only the generating portion for the ultrasonic wave need be and may be readily replaced, thus presenting many advantages in practical applications. Still yet further, the tenth modification uses an increased thickness portion at the connecting portion between the tip of the amplitude amplifying portion and the hollow cylinder so that the strength of the connecting portion is increased and thus there may be obtained stable ultrasonic vibration.

Figure 22A:
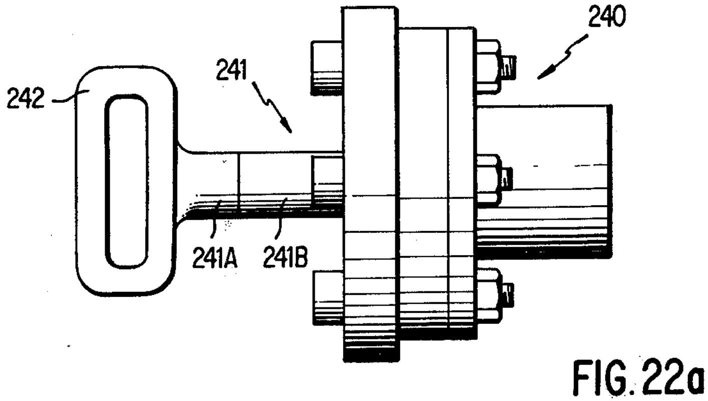
FIGS. 22(*a*) and 22(*b*) are views similar to those of FIGS. 19(*a*) and 19(*b*), showing however an eleventh modification of the present invention.
Figure 22B:
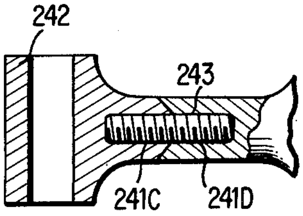

A description will now be given of the fifth embodiment and of the eleventh modification of the present invention, by referring to FIGS. 22(*a*) and 22(*b*). The feature of this modification lies in the fact that the transverse cross-sectional configuration of the vibratory member 242 of a hollow cylindrical body is a rectangle. In addition, there are formed convex and concave portions which may be mated with each other, upon or within the tip portion 241A of the mechanical vibration output portion 241 and the joint face of the rear end portion 241B of the mechanical vibration output portion 241, whereby both portions 241A and 241B may be securely engaged with each other.

The essential parts of this modification will now be described in greater detail. The ultrasonic vibration amplifying portion of the amplitude amplifying type ultrasonic transducer 240, having a stepped type horn within the eleventh modification, consists of two components as within the tenth modification. The vibratory member is integrally secured to one end of the tip portion 241A of the mechanical vibration output or amplitude amplifying portion of the ultrasonic vibration amplifying block 241, through means of the connecting portion and the increased thickness portion, and the axis of the vibratory member is seen disposed perpendicular to the axial line of the tip portion of the mechanical vibration output portion.

There is also formed a convex portion upon the other end of the tip portion 241A of the mechanical vibration output portion, while a concave portion, for mating with the aforenoted convex portion, is similarly defined within the tip end face of the rear end portion 241B of the mechanical vibration output portion. There is further defined threaded bores 241C and 241D within the opposing end faces of the rear end portion 241B and the tip portion 241A, and consequently, both portions may be coupled to each other by means of a bolt 243 which is threadedly engaged within the aforenoted threaded bores 241C and 241D when the aforenoted portions are secured together. As a result, the aforenoted portions may be further rigidly secured to each other due to the wedging of the end faces thereof and the convex and concave portions defined therein. Meanwhile, the remaining structural arrangement of this modification remains unchanged as compared with that of the tenth modification.

Figure 23:
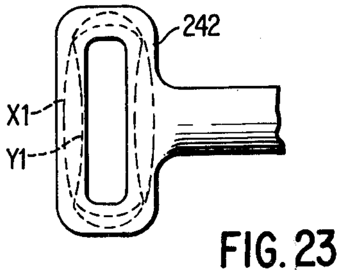
FIG. 23 is a plan view showing the operation of the apparatus of FIGS. 22(*a*) and 22(*b*)

The hollow vibratory member of the eleventh modification is so designed as to cause flexural vibration according to the basic vibrational mode, whereby, as shown within FIG. 23, the vibratory member is subjected to vibration as shown by the chain line X1 at half cycle intervals, and in addition, is also subjected to vibration, as shown by the chain line Y1, at subsequent half cycle intervals. Accordingly, the ultrasonic wave generator according to the eleventh modification generates an ultrasonic wave of a large amplitude from both the inner and outer peripheral walls of a hollow cylindrical body which is being subjected to flexural vibration, and thus achieves the functions and advantages of the present invention, as within the tenth modification.

Figure 24A:
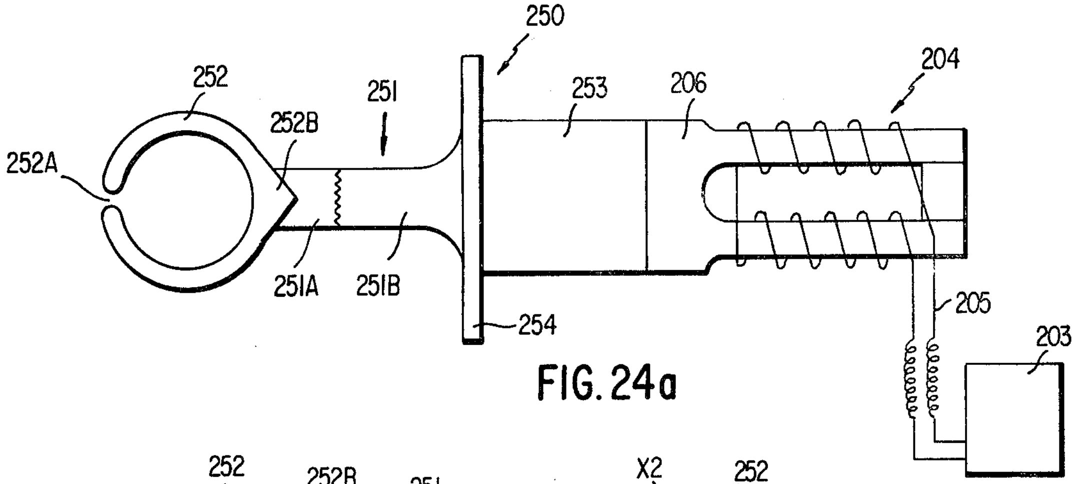
FIGS. 24(*a*) and 24(*b*) are views similar to those of FIGS. 19(*a*) and 19(*b*) showing however a twelfth modification of the present invention.
Figure 24B:
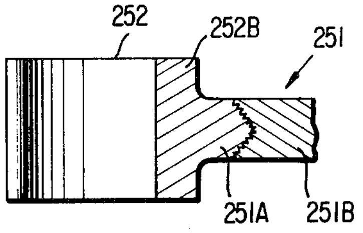
Figure 25:
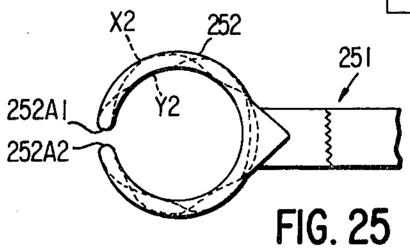
FIG. 25 is a plane view showing the operation of the apparatus of FIGS. 24(*a*) and 24(*b*)

Considering now the fifth embodiment and the twelfth modification of the present invention as shown within FIGS. 24(*a*) and 24(*b*), the twelfth modification features a slit 252A, extending in the axial direction of the hollow cylinder, defined within the circumferential wall of the hollow cylinder of a vibratory member 252, unlike the structures of the seventh to eleventh modifications. Within this modification, the mechanical vibration amplifying portion generally indicated by the reference character 250 comprises a stepped type horn, while its mechanical vibration output portion 251 consists of two components, as in the tenth and eleventh modifications.

The vibratory member 252 is secured to the tip portion 251A of the mechanical vibration output portion, with its axis being disposed perpendicular to the axis of the tip portion 251A of the mechanical vibration output portion, and a connecting portion is formed therebetween with an increased thickness portion, that is, a rib 252B in the form of a projection having a triangular columnar shape as in the case of the ninth modification of the fourth embodiment. The configuration of the hollow cylinder and the rib structure thereof includes the increased thickness portion such that the exterior side portions of the rib tangentially contact the outer circumferential surface of the hollow cylinder provided at the connecting portion of the mechanical vibration amplifying member, and in this manner, the mechanical strength of the connecting portion of the hollow cylinder and the mechanical vibration amplifying member is increased. The other end face of the tip portion 251A of the aforenoted mechanical vibration output portion is formed with a convex portion as seen within FIG. 24(*b*), and the end face of the rear end portion 251B of the mechanical vibration output portion is similarly formed with a concave portion which is to be mated with the aforenoted convex portion, whereby both portions 251A and 251B are rigidly secured to each other by suitable bonding means, such as, for example, brazing or the like.

A magnetostrictive type ultrasonic wave transducer 204 is secured to the rear end face of the mechanical vibration input portion 253, and the aforenoted magnetostrictive ultrasonic wave transducer 204 comprises a magnetostrictive element 206 around which is wound several turns of a lead wire 205 which is connected to an oscillator 203 for generating an untrasonic wave. In addition, the mechanical vibration amplifying portion 250 is formed with a flange portion 254 which is located at the position wherein the longitudinal vibration is nullified, that is, at a node of the vibration, the aforenoted flange portion 254 supporting the mechanical vibration amplifying portion 250.

According to the twelfth modification, the vibratory member of a hollow cylindrical body has a slit or a discontinued wall portion 252A within the circumferential wall thereof, whereby there results a different resonance frequency of the flexural vibration as compared with that of the aforenoted embodiment. However, the vibratory mode thereof is such that, as shown within FIG. 25, the vibratory member 252 is subjected to a vibration illustrated by the chain line X2, at half cycle intervals of the vibration, in the instance that the same is subjected to a third order of flexural vibration, as well as an antiphase vibration as shown by the chain line Y2, at subsequent half cycle intervals. In this respect, the positions of the edge portions 252A1 and 252A2 defining the slit 252A are located so as to correspond to the crests of the vibrations, and thus the mode of flexural vibration of the vibratory member 252 is the same as those of the preceding modifications. Accordingly, an ultrasonic wave of a large amplitude may be generated from the inner and outer circumferential surfaces of the hollow cylindrical body which is being subjected to such flexural vibrations, and thus, the twelfth modification achieves the functions and advantages of the present invention as in the tenth and eleventh modifications.

In addition, according to the twelfth modification, the provision of the slit or discontinued wall portion, extending in the axial direction and disposed within the wall of the hollow cylindrical body, moderates the vibratory tension stresses within the circumferential direction of the vibratory member thereby preventing any damage from occurring within the vibratory member while facilitating the generation of an ultrasonic wave of a large amplitude.

Still further, in accordance with the twelfth modification, there is also provided an increased thickness portion 252B for the joint portion interposed between the amplitude amplifying portion and the hollow cylindrical body, whereby the strength of the joint portion may be increased. Yet further, there is also provided concave and convex portions within or upon the joint faces of the two components 251A and 251B whereby the joint area thereof may be increased with a resulting increase in the joint strength thereof.

Figure 26:
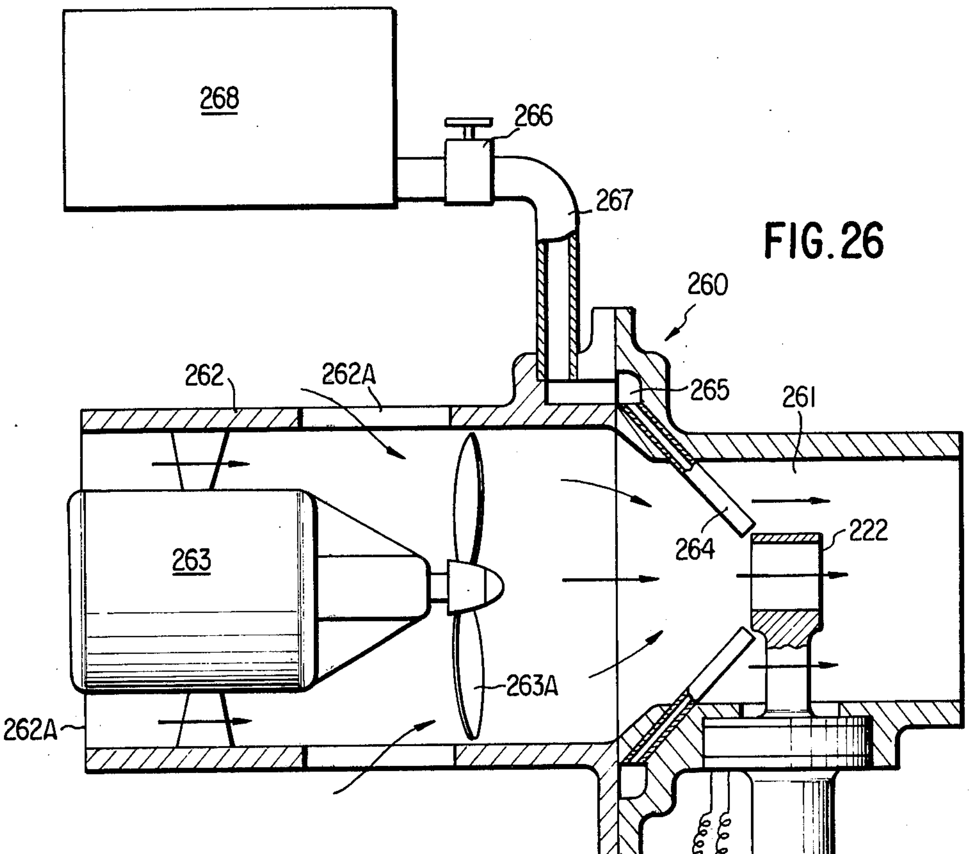
FIG. 26 is a view similar to that of FIG. 13, utilizing however the apparatus of FIGS. 20(*a*) and 20(*b*)

A description will now be set forth in considering the instance wherein the ultrasonic wave generator according to the present invention is embodied within a water atomizing chamber of a humudifier, with a particular reference being made to FIG. 26, wherein there is disclosed, mounted upon the inner, lower wall portion of a water atomizing chamber 261 of a humidifier 260, an ultrasonic wave generator including a hollow cylindrical ultrasonic vibratory member 222 projecting radially into the water atomizing chamber 261 and with its axial line thereof in coincidence with the longitudinal axis of the water atomizing chamber 261.

One end of the water atomizing chamber 261 is open while the other end thereof is in communication with the exit of a blower cylinder 262. Mounted within the blower cylinder 262 is a motor 263 which is adapted to drive a fan 263A, air intake openings 262A being defined within the side wall and extrance end of the cylinder 262, respectively. Small-diameter water supply conduits 264 are disposed within the water atomizing chamber 261 in an angularly oriented, radially projecting relation, the tip portions thereof facing the end face of the hollow cylindrical ultrasonic vibratory member 222 upon the side of the blower cylinder 262.

The aforenoted water supply conduits 264 are in communication with an annular water chamber 265 defined within the outer circumferential surface of the wall of the water atomizing chamber 261 and the blower cylinder 262, and the water chamber 265 is in communication, by means of a conduit 267 having a cock valve 266 therein, with a water reservoir 268 disposed above chamber 265. As a result, water within the water reservor 268 may be fed by means of the water supply conduits 264 to the surface of the hollow cylindrical ultrasonic wave vibratory member 222, an ultrasonic wave oscillator 218 being connected thereto by means of lead wires 217.

The operation and functions of the aforenoted humidifier 260 will now be described hereunder. When the ultrasonic wave oscillator 218 is energized, the ultrasonic wave vibratory member 222 of the hollow cylindrical body will vibrate with a large amplitude. The motor 263 will be driven so as to introduce air through the air intake opendings 262A by means of the fan 263A, whereby the air is fed from the blower cylinder 262 towards the water atomizing chamber 261, while the cock valve 266 is opened so as to supply water from the water reservoir 268, by means of the conduit 267 and water chamber 265, to the tips of the water supply conduits 264 for conveying the same onto the surface of the vibratory member 222.

The water which has been supplied to the surface of the hollow cylindrical vibratory member 222 is then dispersed over the entire inner and outer circumferential surfaces of the hollow cylindrical vibratory member 222 thus forming water films thereon which in turn are divided into groups of minute particles of water due to the ultrasonic vibration thereof, such being followed by sprinkling and atomizing of the same from the vibrating surfaces of the vibratory member. The water thus atomized is then discharged through means of the open end of the water atomizing chamber 261 and into the atmosphere, the same being entrained within the air from the fan 263A so as to thereby add moisture to the air. In this case, since the area of the vibrating surfaces of the vibratory member 222 is quite large, a great amount of water may be atomized per a predetermined unit of time.

Figure 27:
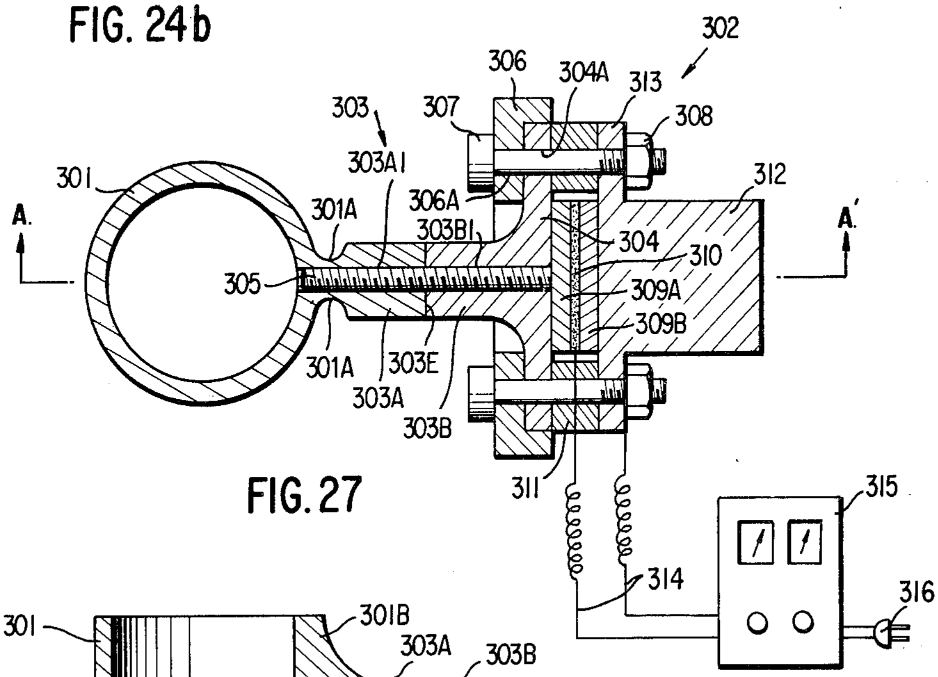
FIG. 27 is a horizontal cross-sectional view of a thirteenth modification of an ultrasonic wave generator constructed in accordance with the present invention.
Figure 28:
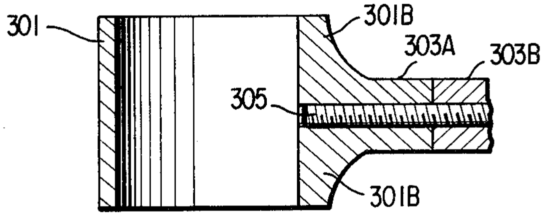
FIG. 28 is a cross-sectional view of the mechanical vibration amplifying portion of the apparatus of FIG. 27 taken along the line A—A′ of FIG. 27.
Figure 29:
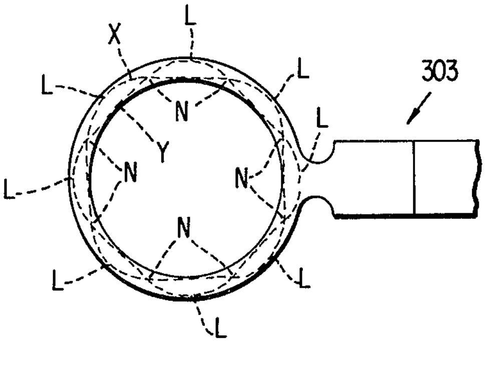
FIG. 29 is a view illustrative of the flexural vibration of the ultrasonic vibratory member of the hollow cylindrical body of the apparatus of FIG. 27.

Considering now the sixth embodiment of the third aspect of the present invention, and with particular reference being made to FIGS. 27–29, the ultrasonic wave generator according to the sixth embodiment of the third aspect of the present invention consists of an ultrasonic-vibration-amplifying type ultrasonic-wave transducer portion 302 which transforms electrical oscillations generated from an ultrasonic wave oscillator into mechanical vibrations and amplifies the amplitude of the mechanical vibrations, and an ultrasonic vibratory member 301 of a hollow cylinder, which member is integrally formed with the tip portion of the mechanical-vibration amplifying portion 303 of the ultrasonic wave transducer portion 302.

The mechanical-vibration amplifying portion 303 of the ultrasonic wave transducer portion 302 is seen to include two components, that is, an amplitude-amplifying tip portion 303A as one member, which is integral with the ultrasonic vibratory member 301 of the hollow cylinder, and an amplitude-amplifying root or rear end portion 303B as another member which has a flange 304 serving as a coupling portion. In addition, both components are integrally fastened to each other by means of an axial bolt 305, the ultrasonic-vibration amplifying portion 303 being of the stepped horn type.

Defined within the amplitude-amplifying tip portion 303A of the mechanical-vibration amplifying portion 303, as well as within the amplitude-amplifying root portion 303B, are bores 303A1 and 303B1 which have female threaded walls and are adapted to threadedly engage bolt 305 which extends therethrough coaxially thereof and in the axial direction of the components. An adhesive may be applied to the threaded walls of the bores 303A1 and 303B1 defined within the tip portion 303A and the root portion 303B when the bolt is brought into engagement with the bores 303A1 and 303B1. The length of the bolt 305 is such as to extend the entire length of the mechanical-vibration amplifying portion, and the bolt 305 is also threaded upon its outer circumferential surface so as to accommodate itself within the aforenoted bores 303A1 and 303B1. Thus, the two components may be rigidly fastened together by means of the bolt 305 and bores 303A1 and 303B1.

The vibratory member 301 is a hollow cylinder having axially opposite ends which are open and having a rectangular columnar projection as an increased thickness portion which is integral with the outer circumferential wall thereof and which extends in a direction parallel with the longitudinal axis over the entire length thereof. Member 301 is integrally formed with the amplitude-amplifying tip portion 303A, with its longitudinal axis being disposed perpendicular to the longitudinal axis of the mechanical vibration amplifying portion 303, and in addition, arcuate cuts 301A, approximately 6 mm in diameter, are defined in a manner so as to be smoothly formed within the outer circumferential surface of the vibratory member 301 and positioned in opposing relation to each other, and extending in the axial direction of the vibratory member 301. Still further, a longitudinally extending increased-thickness portion 301B is integrally provided upon the vibratory member in such a manner as to extend in the axial direction of the vibratory member 301, as best seen in FIG. 28.

The root porton 303B of the mechanical-vibration amplifying portion is formed with a flange 304 serving as a coupling portion, while a plurality of bolt bores 304A are defined within the flange 304 equiangularly along the circumferential extent thereof. A support ring 306, which reinforces the bending rigidity of the flange 304, is fitted upon the outer circumference of the flange 304 and is also formed with bores 306A in positions which correspond to those of the bolt bores 304A within the flange 304, and thus the flanges of the mechanical vibration amplifying portion 303 and backing block 312, which oppose each other, may be fastened together by means of bolts 307, engageable within the bores 306A and 304A, and nuts 308 fitted upon the bolts 307, with the ultrasonic wave transducer consisting of the piezoelectric elements 309A and 309B, electrode plate 310, and spacer plate 311 being interposed therebetween. The piezoelectric elements 309A and 309B have their positive poles opposed to each other, with the electrode plate 310 sandwiched therebetween, and have their negative poles in contact with the flanges 304 and 313, respectively.

Connected to the electrode plate 310 and flange 313 are electrical vibration input lead wires 314, which are in turn conncted to the output side of an ultrasonic wave oscillator 315, the input side of which is of course connected to an electrical connector plug 316 which in turn is connected to an electric power source, not shown. The spacer plate 311 is of an annular form and made of, for example, silicon rubber or the like, and is also formed with bores allowing insertion of the bolts 307 therethrough. In addition, a space is defined within the central area of the plate 311 in such a manner that the piezoelectric elements 309A and 309B and the electrode plate 310 are able to be housed therein. As has been described earlier, the piezo-electric elements 309A and 309B and the electrode plate 310 are secured, by means of the bolts 307 and nuts 308, between the flanges 304 and 313.

As a result, the ultrasonic vibratory member 301 of the hollow cylinder, the ultrasonic-vibration amplifying portion 303, the piezo-electric elements 309A and 309B, and the backing block 312 may cause resonance at a given frequency, with the amplitude of vibration being amplified whereby the vibratory member may be subjected to flexural vibration. In other words, two components 303A and 303B constituting the mechanical-vibration amplifying block 303 cause longitudinal vibrational resonance of a mode corresponding to ½ of the wave length, with an end surface of the flange 304 upon the side of the support ring 306, being positioned at a node of vibration, and the coupling portion to the vibratory member 301 being positioned at a crest or antinode of vibration.

The length of the through-bolt 305 adapted to fasten together the two components 303A and 303B is substantially the same as the entire length of the mechanical vibration amplifying portion, and in this manner, the bolt may cause the resonance in a vibrational mode identical to that of the mechanical-vibration amplifying portion. On the other hand, the length of the backing block 312 is so designed that it causes resonance for the longitudinal vibration of a mode corresponding to ½ of the wave length, with the end surface of the flange 304 on the side of the support ring 306 being positioned at a node of vibration.

In addition, the vibratory member 301 of the hollow cylindrical body has increased thickness portions which are integral with the tip portion of the ultrasonic vibration amplifying portion 303, and the vibratory member 301 is a hollow cylinder having a constant wall thickness, and the inner and outer diameters and the height thereof are so designed as to cause resonance at the same frequency as that of the resonance frequency of the transducer 302. As shown within FIG. 29, the vibratory member causes transverse vibrations along the circumference thereof, with a plurality of antinodes L and nodes N of the vibration being arranged alternately thereabout, and it is of course appreciated that the ultrasonic wave oscillator 315 provides electrical oscillations, having a frequency corresponding to the aforenoted resonance frequency, to the piezoelectric elements 309A and 309B.

The dimensions of a relatively small vibratory member of a hollow cylindrical body, which is made of, for example, an aluminum alloy, as shown within FIG. 29, will be given as an example. In this respect, the vibratory member causes resonance in the fourth-order flexural-vibratory mode at a resonance frequency of 38.40 KHz. The inner diameter of the hollow cylindrical body is 22.62 mm, the outer diameter 25.38 mm, the height 20 mm, the radius of each arcuate cut in the connecting portion 3 mm, and the thickness of the connecting portion in the circumferential direction upon the bottom of the arcuate cuts is 5.0 mm. The type of materials and dimensions should not necessarily be limited to those given, and thus, those factors may be optionally changed as far as the resonance frequency of the hollow cylindrical body is brought into coincidence with the resonance frequency of the ultrasonic wave transducer.

In operation of the sixth embodiment, when the ultrasonic wave oscillator 315 is energized by being connected to an electrical power source, the oscillator 315 imparts electrical oscillations of the same frequency as the resonance frequency of the ultrasonic wave generator to the piezoelectric elements 309A and 309B thereby causing mechanical vibration of the same which in turn subjects the ultrasonic wave transducer 302 to the longitudinal resonance vibration within a half-wave resonance mode with the end surface of the flange 304 upon the side of the support ring 306 being positioned at a node of vibration.

The amplitude of the mechanical vibration is then of course amplified by means of the ultrasonic-vibration amplifying portion 303 having a joint portion 303E, and vibratory displacement having an amplitude thus amplified is then transmitted through means of the increased thickness portion 301B to the aforenoted vibratory member throughout its axial extent thereof. As a result, the vibratory member 301 undergoes flexural vibration of a large amplitude, thereby generating ultrasonic waves from its inner and outer circumferential surfaces in the radial direction.

With reference to FIG. 29, a description will be given in greater detail of the fourth-order-flexural-vibration of the vibratory member. The vibratory member is subjected to the vibratory mode as shown by the chain line X at half cycle intervals of vibration, and is also subjected to the antinode vibratory node as shown by chain line Y at the subsequent half cycle intervals. For example, in the case of 38.4 KHz, such a cycle will be repeated 38,400 cycles per second.

In accordance with the ultrasonic wave generator of the sixth embodiment, the ultrasonic-vibration amplifying portion 303 is divided into two components, that is, the amplitude-amplifying tip portion 303A integral with the vibratory member 301, and the amplitude-amplifying root portion 303B, and both components are secured together by means of a through-bolt 305 having a length the same as that of the ultrasonic-vibration amplifying portion, the aforenoted bolt 305 having a threaded outer circumferential surface which facilitates accommodation thereof within the rigid mounting of the two components 303A and 303B.

In addition, the bolt 305 itself is so designed as to cause resonance in the same vibratory mode as that of the ultrasonic-vibration amplifying portion, and consequently, the bolt 305 serves as an integral part of the ultrasonic vibration amplifying horn having an ideal cross-sectional configuration. As a result, the ultrasonic-vibration amplifying portion 303 may transmit the mechanical vibrations to the vibratory member 301 without losing the vibratory energy of the mechanical vibrations, and in this manner, an ultrasonic wave may be generated in an efficient manner. The adoption of the throughbolt 305 within the sixth embodiment allows an increase in the length and area of the joint 303E thereby increasing the coupling strength of the two components 303A and 303B, and this further insures stable vibration for a long period of time as well as the prevention of fatigue cracking within the coupling portion.

The sixth embodiment of the invention thus provides advantages of sufficient and positive coupling of the mechanical-vibration amplifying portion to the vibratory member. The joint 303E is disposed at a point substantially intermediate the length of the vibration-amplifying portion 303 so as to allow the vibration of the two components within the same phase and within the same vibratory mode, and consequently, mutual vibratory displacements of the two componets 303A and 303B will not be adversely constrained, and there will be no concentration of vibratory stress at the joint 303E thus enabling rigid and stable coupling together of the two components.

In addition, the ultrasonic wave generator of the sixth embodiment generates an ultrasonic wave from vibrating surfaces having a large surface area, that is, from the inner and outer circumferential surfaces of the vibratory member 301 of the hollow cylindrical body, while the vibratory member is integrally connected to the tip portion of the ultrasonic-vibration amplifying portion and has increased thickness portions extending in the axial direction thereof. This permits uniform and positive transmission of ultrasonic waves to the vibratory member and increases the mechanical strength of the coupling portion between the vibratory member and the mechanical-vibration amplifying portion which in turn enables the stable generation of an ultrasonic wave for a long period of time and prevents fatigue cracking within the coupling portion of the vibratory member, even if the vibratory member is subjected to continuous vibration for a long period of time.

Still further, according to another feature of the sixth embodiment, two arcuate cuts 301A having a given radius of curvature, such as for example, 6$\phi$ or 6 mm in diameter, are defined within the connecting portion between the vibratory member and the component 303A so as to extend along the axial direction of the vibratory member 301 and thereby minimize the circumferential thickness of the connecting portion of the vibratory member so as to render the rigidity thereof to a low value, whereby, even in the case of using a relatively small-sized vibratory member, may readily be generated flexural vibration inherent to the cylindrical body, and yet the flexural vibration may be generated in a stable manner without hindering the vibratory mode of the vibratory member. Accordingly, even in the instance that the vibratory member is subjected to a continuous vibration of a large amplitude for a long period of time, there will not be produced an abnormal vibratory stress within the circumferential surface of the vibratory member, caused by excessive rigidity of the coupling portion. This of course prevents fatigue failure and cracking along the circumferential surface of the vibratory member.

Figure 31:
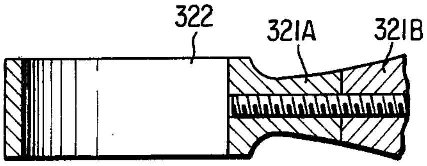
FIG. 31 is a vertical cross-sectional view of the mechanical vibration amplifying portion of the apparatus of FIG. 30.
Figure 30:
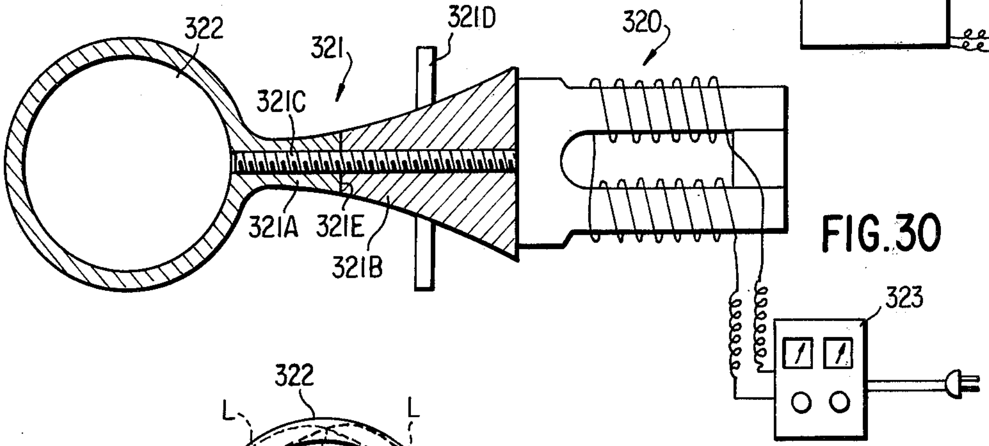
FIG. 30 is a view, partly in cross-section, of a fourteenth modification of an ultrasonic wave generator constructed in accordance with the present invention.
Figure 32:
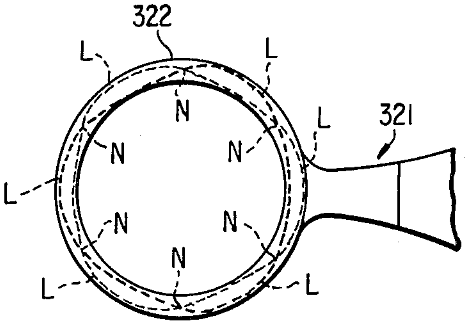
FIG. 32 is a view illustrative of the flexural vibration of the ultrasonic vibratory member of the hollow cylindrical body of the apparatus of FIG. 30.

The description of the present invention will now proceed with the consideration of the seventh embodiment of the present invention as disclosed within FIGS. 30–32. According to the seventh embodiment, a mechanical-vibration amplifying portion, generally indicated by the reference character 321, is seen to include an exponential type horn, and an ultrasonic wave transducer 320. The ultrasonic wave transducer 320 is connected to an ultrasonic wave oscillator 323 so as to transform electrical oscillations into mechanical vibrations, and in this respect, the transducer 320 may be either of a piezoelectric type or of a magnetostrictive type, the magnetstrictive type being used within this embodiment.

The mechanical-vibration amplifying portion 321, which is comprised of two components, that is, an amplitude-amplifying tip portion 321A as one member thereof, and an amplitude-amplifying root portion 321B as the other member thereof, is adapted to be coupled to the ultrasonic wave transducer 320, and as in the sixth embodiment, the two components are fastened together by means of a through-bolt 321C extending substantially the entire longitudinal extent of the components in the axial direction thereof.

An ultrasonic vibratory member 322 is integrally secured to the amplitude amplifying tip portion 321A of member 321 through means of a connecting portion having an increased thickness portion the side wall portions of which tengentially contact the outer circumferential surface of the hollow clyinder, the longitudinal axis of member 322 being disposed perpendicular to the longitudinal axis of the mechanical-vibration amplifying portion 321. The vibratory member 322 is a hollow cylinder having its opposite ends open, and in addition, as shown within FIG. 31, the outer circumferential surface of the vibratory member is smoothly united into the outer surface of the tip portion 321A of member 321 in an integral manner. Still further, the magnetostrictive type transducer 320 is bonded to the large-diameter edge surface of the amplitude-amplifying root portion 321B of the exponential horn 321.

In this manner, the vibratory member 322 of a hollow cylindrical body, the mechanical-vibration amplifying portion 321, and the magnetostrictive type transducer 320 are so designed as to cause resonance vibration at the same resonance frequency. The components 321A and 321B of the mechanical-vibration amplifying portion 321 cause resonance in an integral fashion, while the joint portion defined between the magnetostrictive type transducer 320 and the root portion 321B, and the joint portion defined between the vibratory member 322 and the tip portion 321A serve as the antinodes of vibration. As a result, the aforenoted resonance is generated longitudinally having a resonance mode corresponding to a half wave, and the length of the through-bolt fastening together the two components 321A and 321B is substantially the same as that of the mechanical-vibration amplifying portion 321 whereby the vibratory member may cause resonance in the same vibratory mode as that of the mechanical-vibration amplifying portion 321.

In addition the vibratory member 322 of a hollow cylindrical body, which is integral with the tip portion of the ultrasonic-vibration amplifying portion 321 has a uniform wall thickness, while the inner and outer diameters, and the height thereof are so designed as to cause resonance at the same frequency as the resonance frequency of the mechanical-vibration amplifying portion 321. Within the seventh embodiment, the diameter of the vibratory member of a hollow cylindrical body is greater than that of the vibratory member within the sixth embodiment, while the height of the vibratory member within the seventh embodiment is less than that within the sixth embodiment, and therefore, the vibratory member may vibrate in the third-order flexural vibratory mode. In other words, the vibratory member provides a vibratory mode, within which six antinodes L and nodes N of vibration appear alternately along the circumference of the vibratory member 322.

A support plate 321D is also provided in operative association with the mechanical-vibration amplifying portion 321 and is positioned at a node of vibration, that is, where the longitudinal vibration is nullified, the support plate 21D supporting the mechanical-vibration amplifying portion by means of being secured to a support member, not shown. The ultrasonic wave oscillator 323 of course imparts electrical oscillations, having the frequency of resonance described, to the magnetostrictive type transducer 320.

According to the seventh embodiment, the electrical oscillations imparted from the ultrasonic wave oscillator 323 are transformed into mechanical vibrations by means of the magnetostrictive type transducer 320, and the vibratory member 322 cause flexural vibration at an amplitude further amplified thereby generating ultrasonic waves from its surface having a large surface area, and thereby presenting the same results as that of the sixth embodiment. In other words, even if the vibratory member is subjected to continuous vibration for a long period of time, fatigue cracking may be prevented at the joint portion 321E due to the fact that the throughbolt 321C has a large resonant vibration, a large coupling surface defined by the interengaged threaded circumferential surfaces with member 321, and because the joint portion 321E defined between the two components is positioned at a point corresponding to approximately $\frac{1}{3}$ the length of the amplitude-amplifying portion 321 as measured from its tip. These factors insure stable generation of an ultrasonic wave for a long period of time.

Still further, the coupling of the vibratory member to the mechanical-vibration amplifying portion may be accomplished in a simple but positive manner thereby facilitating the manufacture of an ultrasonic-wave generator having high reliability and performance. It is to also be noted that the mechanical strength of the connecting portion defined between the vibratory member 322 and the mechanical-vibration amplifying portion may be maintained high by means of the increased thickness portion and the integral formation thereof as in the case of the sixth embodiment, and yet further, the seventh embodiment permits use to be made of a relatively simple ultrasonic wave transducer which, in turn, thereby permits use to be made of a large input or high power transducer which facilitates the generation of extremely strong ultrasonic waves.

It will of course be appreciated that various modifications of the first aspect of the present invention are possible, and within the above-mentioned modifications and applications, magnetostrictive elements and piezoelectric elements have been used as the ultrasonic wave transducer. However, the first aspect of the present invention is by no means limited to the use of those structures, but in lieu thereof, other structures having similar functions of generating mechanical vibrations may be used. In addition, those types, within which piezoelectric elements and magnetostrictive elements are used, are only illustrative of the modifications of the present invention, and various other modifications and alterations may also be effected.

Although the description has also been given of a conical type horn, a catenary type horn, and a stepped type horn within the above embodiments of the present invention, the first aspect of the present invention is also by no means limited to these structures, and again, any type structure which may amplify the mechanical vibrations may of course be used, such as, for example, an exponential type, Fourier type or other type horns may be used in lieu of the structures illustrated.

Furthermore, within the above embodiments, a hollow elliptical column and a hollow cylindrical body as the hollow annular members were used as the vibratory member, however, the first aspect of the present invention is again not limited to those structures. Thus, any hollow annular body having a small wall thickness may be used, such as for example, a hollow polygonal column, a hollow cylindrical body which is made by bending a rectangular sheet so as to form a cylindrical portion and an overlapped portion, with the overlapped portion being integrally secured to the tip portion or the output end of the mechanical vibration amplifying portion by suitably welding or brazing the same, or the like.

In addition, within the above modifications representing the first and third embodiments, the shape of the rib, that is, the increased thickness portion of the cylindrical ultrasonic vibratory member, should also not be construed in a limited sense. A columnar rib 112 having a trapezoidal cross section as shown, for example, within FIG. 14(*a*) may be used, or alternatively, a columnar rib 113 having a rectangular cross section as shown within FIG. 14(*b*may be used. Otherwise, a columnar rib 114 having a semi-circular cross-section as shown in FIG. 14(C) may be used, it being further noted that while the ribs are provided upon the outer circumferential surface of the cylindrical body, they may likewise be provided upon the inner circumferential surface thereof.

Still further, as shown within FIG. 15(A), a rib having a triangular columnar shape in cross-section may be formed upon the outer circumferential surface of the cylindrical body, and it will be noted that the portion of the inner circumferential surface which forms the rear surface of the rib 115, is flat or planar. Similarly, as shown within FIG. 15(B), the outer peripheral surface of the rib may be of a trapezoidal configuration, and the portion of the inner circumferential surface thereof, which forms the rear surface of the rib 116, is also flat or planar. In addition, as shown within FIG. 15(C), the outer peripheral surface of the rib may be of a rectangular columnar shape, while that portion of the inner circumferential surface, which forms the rear surface of the rib 117, is flat, and still further, as shown within FIG. 15(D), the outer peripheral surface of the rib 118 may have a semi-circular columnar shape, while that portion of the inner circumferential surface, which serves as the rear surface of the rib 118, is flat.

In summary, then, the rib upon the cylindrical, ultrasonic vibratory member should be an increased thickness, columnar shaped portion extending over the entire axial length of the cylindrical body and integrally formed upon the side circumferential surface of the cylindrical body, with its longitudinal axis disposed parallel with the longitudinal axis of the cylindrical body. The increased thickness portion is intended to increase the bending rigidity thereof and uniformly transmit vibrational displacements to the cylindrical body over the entire length thereof, the aforenoted displacement being amplified by means of the ultrasonic-vibration amplifying metal block.

Thus, it is apparent that the configuration of the rib is not limited, as has been described earlier, and the width *a* of the rib as shown within FIGS. 14(A)-14(C) and FIGS. 15(A)-15(D) should not necessarily be limited to the illustrated conditions, although it is desirable that the width of the rib be within one-half wave length of the flexural vibration of the cylindrical vibratory member for the purpose of easily generating flexural vibration of a desired order.

Figure 16A:
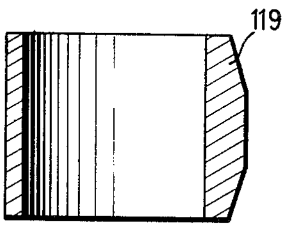
FIGS. 16(*a*) and 16(*b*) are partial, vertical cross-sectional views of other ribbed vibratory members.
Figure 16B:
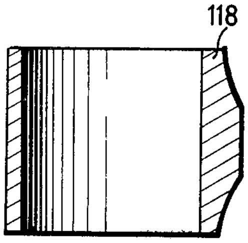

The thickness of the rib should be at least greater than the wall thickness of the other portions of the cylindrical body over the entire length of the cylindrical body, however, the thickness of the rib does not necessarily have to be uniform over the entire axial length of the cylindrical body. Thus, as shown within FIG. 16(A), the thickness of the rib may be varied in linear proportion, or as shown within FIG. 16(B), the thickness of the rib may be varied, in accordance with a non-linear pattern. In addition, the rib does not necessarily have to extend over the entire axial length of the cylindrical body, but in some cases, may extend over only 2/3 or less of the entire length of the cylindrical body. It is of course appreciated however, that with the cylindrical ultrasonic vibratory members, as shown within FIGS. 14–16, in the instance that such a vibratory member is coupled to the mechanical-vibration output end of the ultrasonic vibration amplifying metal block by means of a bolt, the rib of each vibratory member should be provided with a bolt bore.

With the aforenoted respective modifications, the coupling, for example, of the ultrasonic-vibration amplifying metal block 2 to the rib 111 of the cylindrical vibratory member 1, the coupling of the flange 2B of the block 2 to the flange 11A of the backing metal block 11 through means of the spacer plate 10, and the coupling of the metal block 2 to the ultrasonic wave transducer 15 does not necessarily have to be effected by fastening means, such as for example, bolts, but bonding means, such as for example, brazing or welding, or else, both bonding and fastening means, may be employed.

The amplifying rate of the amplitude of vibration by means of the metal block 2 is dependent upon the ratio of the cross-sectional area of the backing metal block 11, or the columnar block 15A, to the cross-sectional area of the mechanical vibration output end 2A which cross-sectional area is taken perpendicular to the longitudinal axis of the end 2A. In addition, by providing the metal block 2 with an elongated bore extending from the output end 2A to at least the flange 2B, so as to thereby increase the diameter of block 2, there will result a further improved bending rigidity thereof, as compared with a solid metal block having a small diameter. As a result, bending vibration which is harmful to the strength of the joint portion defined between the vibratory member 1 and the block 2 does not readily occur.

A description has been given of only a humidifier as an example of an application of the ultrasonic wave generator constructed in accordance with the first aspect of the present invention, however, the first aspect of the present invention is by no means limited to such an exemplary application, but may be applied to ultrasonic wave generating sources of an apparatus, such as for example, a carburetor, for atomizing liquids by use of ultrasonic waves, liquid emulsifying apparatus, emulsifying mixing apparatus, chemical reaction accelerating apparatus for gases, cleaning apparatus, painting apparatus or the like.

Similarly, considering modifications of the second aspect of the present invention, while the description has been given thus far of various modifications and their applications wherein magnetostrictive or piezoelectric type elements are used as ultrasonic wave transducers, the second aspect of the present invention should by no means be construed in such a limited sense, and thus other means for generating mechanical vibrations may be used. In addition, various modifications of a transducer of the type which uses piezoelectric or magnetostrictive elements may be effected as well.

Within the embodiments, the mechanical vibration amplifying portion is shown as being of the conical type horn, exponential type horn, and the stepped type horn, however, the second aspect of the present invention is by no means limited to those structures, and thus any type of structure, which amplifies the mechanical vibrations, may be used, such as for example, a catenary type horn, Fourier type horn, and/or other type horns.

In addition, the hollow cylindrical body, operatively associated with the mechanical vibration amplifying portion, is disclosed as being of a hollow rectangular column and of a hollow cylinder, however, the second aspect of the present invention is not limited to such structures, and thus a hollow elliptical column and a hollow polygonal column, or other similar structures, may be used as the vibratory member.

In summary, the second aspect of the present invention presents an ultrasonic wave generator which includes an ultrasonic wave transducer connected to an ultrasonic wave oscillator for transforming electrical oscillations into mechanical vibrations, a mechanical vibration amplifying portion integrally secured to the ultrasonic wave transducer for amplifying the amplitude of the mechanical vibrations transmitted from the ultrasonic wave transducer, and a vibratory member of a hollow cylindrical body, which is disposed at the tip of the mechanical vibration output portion of the mechanical vibration amplifying portion, the generator being characterized by the mechanical vibration amplifying portion, which integrally comprises a joint portion, an amplitude amplifying portion secured to the joint portion, and a hollow cylindrical portion secured to the tip of the amplitude amplifying portion.

The ultrasonic wave generator according to the second aspect of the present invention facilitates the generation of an ultrasonic wave of large amplitude from the inner and outer circumferential surfaces of the hollow cylindrical body within the mechanical vibration amplifying portion having a vibrating surface of large surface area, as well as increases the mechanical strength of the joint portion defined between the vibratory member and the mechanical vibration output portion, while insuring positive transmision of the ultrasonic waves to the vibratory member, whereby there may be achieved generation of ultrasonic waves in a stable manner for a long period of time, and wherein further, fatigue failure and cracking within the joint portion is prevented even if the vibratory member is subjected to continuous vibration for a long period of time.

Considering the foregoing still further, the description has been given only of a humidifier as a practical application of an ultrasonic wave generator constructed in accordance with the second aspect of the present invention, however, the second aspect of the present invention is by no means limited to this application, but may be applied to a liquid atomizing device, such as, for example, a carburetor, using ultrasonic waves, a liquid emulsifying device, a liquid emulsifying and mixing device, a chemical reaction accelerating device for gases, a cleaning device, an ultrasonic wave generating source for a painting device, or the like.

Considering next the modifications of the third aspect of the present invention, while the description has been given of the sixth and seventh embodiments as including stepped and exponential type horns as the mechanical-vibration amplifying portion, it should not be construed that these embodiments are so limited, and it is to be appreciated that any type horn may be used as long as it is capable of amplifying the amplitude of the mechanical vibration. For example, there may be used a mechanical-vibration amplifying block having a conical type horn, a catenary type horn, a Fourier type horn or the like.

In addition, when the amplitude-amplifying tip portion is integrally secured to the amplitude-amplifying root portion by means of a through-bolt, an adhesive may also be applied to the threaded surface of the bolt as a modification of the seventh embodiment, as in the case with the sixth embodiment. However, the present invention should not necessarily be limited to such instances.

Within the aforenoted embodiments, bolts 305 and 321C are provided in the form of through-bolt fastening means for the two components, but there may alternatively be provided one threaded portion at the joint portion and two additional threaded portions at the ends of the two components 303A, 303B or 321A and 321B on the opposite sides of the joint portion. Still further, additional threaded portions may be provided between each of the threaded portions.

According to the aforenoted embodiments, it is also noted that the joint portions 303E and 321E are positioned at points corresponding to ½ or ⅓ of the entire length of the mechanical-vibration amplifying portion, as measured from its tip, however, the present invention should not necessarily be limited to such interrelationships, and the joint portions may be positioned at any intermediate position between the opposite ends of the mechanical-vibration amplifying portion, depending upon the type of horn used.

In summary, the present invention provides an ultrasonic wave generator of the type, which includes an ultrasonic wave transducer adapted to transform electrical oscillations into mechanical vibrations, a mechanical-vibration amplifying portion which is integrally secured to the ultrasonic wave transducer for amplifying the amplitude of the mechanical vibration transmitted from the ultrasonic wave transducer, and an ultrasonic vibratory member of a hollow cylindrical body, which has its opposite ends open and which is integral with the tip portion of the mechanical-vibration amplifying portion, the longitudinal axis thereof being disposed perpendicular to that of the mechanical-vibration amplifying portion.

The aforenoted ultrasonic generator is thus characterized by the mechanical-vibration amplifying portion which includes two components, that is, an amplitude-amplifying root portion having an increased thickness portion for securing the mechanical-vibration amplifying portion to an ultrasonic wave transducer, and an amplitude-amplifying tip portion, which is integral with an ultrasonic vibratory member of a hollow cylindrical body through means of the increased thickness portion, the aforenoted two components having elongated bores provided therethrough which have threaded walls and which extend in the axial direction thereof and coaxially relation. A through-bolt, of a length substantially the same as the length of the mechanical-vibration amplifying portion, is inserted through the aforenoted elongated bores whereby the aforenoted two components may be integrally fastened to each other.

Still further, the provision of the coupling portion within the mechanical-vibration amplifying portion may prevent stress concentration within the connecting portion defined between the vibratory member and the mechanical-vibration amplifying portion, and yet further, due to the rigid fastening thereof by means of a bolt having a length substantially equal to that of the mechanical-vibration amplifying portion, there may be prevented, peeling of the coupling portion due to vibration of the bolt itself, variation in the vibratory-displacement constraining condition, and hence, fatigue cracking or the like within the joint portion.

The coupling strength may be optionally adjusted, depending upon the length of the threaded portion of the bolt relative to its entire length, and thus, there may be achieved consistent ultrasonic vibration from a large area of the surfaces of the vibratory member, and with a large amplitude, for a long period of time. Still further, the simplicity of coupling the two components together within the mechanical-vibration amplifying portion, in addition to the arrangement of the mechanical-vibration amplifying portion comprising the two components, facilitates the ready fabrication of the mechanical-vibration amplifying portion at low cost.

The ultrasonic wave generator constructed in accordance with the present invention generates an ultrasonic wave from its surfaces of a large surface area, and thus may be applied as an ultrasonic wave source to an ultrasonic-wave-liquid-fuel atomizing apparatus, water atomizing apparatus for use within a humidifier, paint spraying apparatus, liquid emulsifying and mixing apparatus, chemical-reaction-accelerating apparatus for gases, or ultrasonic wave cleaning apparatus.

Obviously, many modifications and variations of the present invention are possible in light of the above teachings. It is to be understood therefore that within the scope of the appended claims, the present invention may be practiced otherwise than as specifically described herein.

What is claimed as new and desired to be secured by Letters Patent of the United States is:

1. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive trnasmission of ultrasonic waves from said mechanical vibration amplifying member to said ultrasonic vibratory member is insured so as to generate ultrasonic waves from said ultrasonic vibratory member in a stable manner for a long period of time;

said mechanical vibration amplifying member and said vibratory member form two separate members;

said vibratory member of said hollow cylindrical body having a predetermined wall thickness and being integrally secured to the other end of said mechanical vibration amplifying member upon its outer circumferential surface; and said increased thickness portion is a rib structure provided on at least one of the joint portions of said vibratory member and said mechanical vibration amplifying member along a side wall surface thereof, whereby said vibratory member is integrally coupled to said mechanical vibration amplifying member through means of said rib structure, and the mechanical strength of said joint portion between said ultrasonic vibratory member and mechanical vibration amplifying member is increased;

said rib structure of said increased thickness portion is integrally formed upon said joint portion of said vibratory member and said mechanical-vibration amplifying member along said outer circumferential surface of said vibratory member in a direction parallel with the longitudinal axis of said vibratory member;

said ultrasonic vibratory member comprises a hollow cylinder provided with said rib structure which has a triangular columnar projection configuration, is integral with the cylindrical wall of said vibratory member, and extends in a direction parallel with the longitudinal axis of said cylindrical body over the entire axial length thereof.

2. An ultrasonic wave generator according to claim 1, wherein:

said rib structure has a bore for housing bolt means therethrough in order to secure said ultrasonic vibratory member to said mechanical vibration amplifying member;

said mechanical vibration amplifying member comprises a stepped type horn; and said ultrasonic wave transducer comprises piezoelectric elements.

3. An ultrasonic wave generator according to claim 2, wherein:

said mechanical vibration amplifying member has an output end which is formed with a recessed portion adapted to matingly engage said triangular columnar projection of said ultrasonic vibratory member and a flange formed on the root portion thereof which is secured to a flange of a cylindrical backing metal block, said piezoelectric elements, a spacer plate and an electrode plate being interposed and secured between said flanges by a plurality of bolts.

4. An ultrasonic wave generator comprising:

an ultrasonic wave oscillator, an ultrasonic wave transducer, connected to said ultrasonic wave oscillator, for transforming an electrical oscillation from said oscillator into a mechanical vibration;

a mechanical vibration amplifying member, having one end thereof integrally secured to one of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said cicumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said mechanical vibration amplifying member and said vibratory member form two separate members;

said vibratory member of said hollow cylindrical body having a predetermined wall thickness and being integrally secured to the other end of said mechanical vibration amplifying member upon its outer circumferential surface; and said increased thickness portion is a rib structure provided on at least one of the joint portions of said vibratory member and said mechanical vibration amplifying member along a side wall surface thereof, whereby said vibratory member is integrally coupled to said mechanical vibration amplifying member through means of said rib structure, and the mechanical strength of said joint portion between said ultrasonic vibratory member and mechanical vibration amplifying member is increased;

said rib structure of said increased thickness portion is integrally formed upon said joint portion of said vibratory member and said mechanical-vibration amplifying member along said outer circumferential surface of said vibratory member in a direction parallel with the longitudinal axis of said vibratory member;

said ultrasonic vibratory member comprises a hollow cylinder which includes said rib structure of a triangular columnar projection configuration and which is integral with the cylindrical wall of said vibratory member and which extends in a direction parallel with the longitudinal axis of said cylindrical body over the entire axial length thereof;

said mechanical vibration amplifying member comprises a stepped type horn including an amplified mechanical vibration output portion supporting said ultrasonic vibratory member, a flange portion, and a mechanical vibration input portion; and said ultrasonic wave transducer comprises a first cylindrical body secured to said mechanical vibration input portion of said mechanical vibration amplifying member, a second cylindrical body, and circular piezoelectric elements and an electrode plate sandwiched between said first and second cylindrical bodies.

5. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive trnasmission of ultrasonic waves from said mechanical vibration amplifying member to said ultrasonic vibratory member is insured so as to generate ultrasonic waves from said ultrasonic vibratory member in a stable manner for a long period of time;

said mechanical vibration amplifying member and said vibratory member form two separate members;

said vibratory member of said hollow cylindrical body having a predetermined wall thickness and being integrally secured to the other end of said mechanical vibration amplifying member upon its outer circumferential surface; and said increased thickness portion is a rib structure provided on at least one of the joint portions of said vibratory member and said mechanical vibration amplifying member along a side wall surface thereof, whereby said vibratory member is integrally coupled to said mechanical vibration amplifying member through means of said rib structure, and the mechanical strength of said joint portion between said ultrasonic vibratory member and mechanical vibration amplifying member is increased;

said rib structure of said increased thickness portion is integrally formed upon said joint portion of said vibratory member and said mechanical-vibration amplifying member along said outer circumferential surface of said vibratory member in a direction parallel with the longitudinal axis of said vibratory member;

said ultrasonic vibratory member comprises a hollow cylinder having a triangular columnar projection which is integral with the cylindrical wall thereof and which extends in a direction parallel with the longitudinal axis thereof over the entire axial length thereof, an axially extending slit-like opening, extending over the entire length thereof, being defined within said cylindrical wall.

6. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said mechanical vibration amplifying member and said vibratory member form two separate members;

said vibratory member of said hollow cylindrical body having a predetermined wall thickness and being integrally secured to the other end of said mechanical vibration amplifying member upon its outer circumferential surface; and said increased thickness portion is a rib structure provided on at least one of the joint portions of said vibratory member and said mechanical vibration amplifying member along a side wall surface thereof;

whereby said vibratory member is integrally coupled to said mechanical vibration amplifying member through means of said rib structure, and the mechanical strength of said joint portion between said ultrasonic vibratory member and mechanical vibration amplifying member is increased;

said rib structure of said increased thickness portion is integrally formed upon said joint portion of said mechanical vibration amplifying member and said rib structure extends along the outer circumferential surface of said vibratory member;

said ultrasonic vibratory member comprises a hollow cylinder having a small wall thickness and made of a light alloy;

said mechanical vibration amplifying member comprises a stepped type horn, secured to an outer cylindrical wall of said hollow cylinder by brazing, having a rectangular cross section of substantially the same longitudinal length as said axial length of said vibratory member, and having a fillet portion as said rib structure with a curvature such that the increased thickness portion tangentially contacts the outer circumferential surface of said vibratory member, whereby the outer portion of said horn having said rectangular cross section smoothly engages said vibratory member; and said ultrasonic wave transducer comprises piezoelectric elements sandwiched and secured between two cylindrical metal blocks by means of bolts, and said transducer is secured to said stepped type horn.

7. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said mechanical vibration amplifying member and said vibratory member form two separate members;

said vibratory member of said hollow cylindrical body having a predetermined wall thickness and being integrally secured to the other end of said mechanical vibration amplifying member upon its outer circumferential surface; and said increased thickness portion is a rib structure provided on at least one of the joint portions of said vibratory member and said mechanical vibration amplifying member along a side wall surface thereof, whereby said vibratory member is integrally coupled to said mechanical vibration amplifying member through means of said rib structure, and the mechanical strength of said joint portion between said ultrasonic vibratory member and mechanical vibration amplifying member is increased;

said rib structure of said increased thickness portion is integrally formed along said outer circumferential surface of said vibratory member and upon both joint portions of said vibratory member and said mechanical vibration amplifying member;

said ultrasonic vibratory member comprising a hollow cylinder having a triangular columnar projection which is integral with the cylindrical wall of said vibratory member and which extends in a direction parallel with the longitudinal axis thereof over the entire axial length thereof;

said mechanical vibration amplifying member comprises a catenary type horn which has an output portion with a rib structure formed so as to have a predetermined radius of curvature and which is secured to said hollow cylinder by bolt means; and said ultrasonic wave transducer comprises a first metal block, of a solid cylindrical body having a T-shaped cross section defining an extended portion, integrally connected to said horn, a second metal block of a solid hollow cylindrical body having a bottom portion, and piezoelectric elements and an electrode plate secured between said metal blocks by means of a nut disposed within an inner chamber of said second metal block and engaged with the extended portion of said first T-shaped metal block.

8. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said ultrasonic vibratory member and said other end of said mechanical vibration amplifying member form one integral member;

said ultrasonic vibratory member and said mechanical vibration amplifying member form one integral member;

said one member comprises a hollow cylinder having a triangular columnar projection which is integral with the outer cylindrical wall of said vibratory member and which extends in a direction parallel with the longitudinal axis of said cylindrical body over the entire length thereof, and an amplitude amplifying portion of a stepped type horn integrally including said connecting portion having said increased thickness portion tangentially contacting said outer circumferential surface of said hollow cylinder and a circular flange portion; and said ultransonic wave transducer comprises a cylindrical metal block having a flange portion, and circular piezoelectric elements and an electrode plate sandwiched between said flange portions of said stepped type horn and said cylindrical metal block by a plurality of bolts which also extend through an annular spacer member interposed between said flange portions and surrounding said elements and said electrode.

9. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said ultrasonic vibratory member and said other end of said mechanical vibration amplifying member form one integral member;

said one member is integrally secured to one end of another member having the other end thereof integrally secured to said ultrasonic wave transducer by fixing means;

said one member comprises a hollow cylinder having a semi-circular columnar projection which is integral with the outer cylindrical wall thereof, and a part of an amplitude amplifying portion of said mechanical vibration amplifying member, the output portion of said mechanical vibration amplifying member of an exponential type horn including said connecting portion with said increased thickness portion tangentially contacting said outer circumferential surface of said hollow cylinder;

said another member being secured to said one member by means of a bolt, and comprising another part of said amplitude amplifying portion, having a flange portion, of said mechanical vibration amplifying member; and said ultrasonic wave transducer comprises a cylindrical metal block having a flange portion, circular piezoelectric elements and an electrode plate sandwiched between said flange portions of said exponential type horn and said cylindrical metal block by a plurality of bolts which also extend through an annular spacer member interposed between said flange portions and surrounding said elements and said electrode.

10. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said ultrasonic vibratory member and said other end of said mechanical vibration amplifying member form one integral member;

said one member is integrally secured to one end of another member having the other end thereof integrally secured to said ultrasonic wave transducer by fixing means;

said one member comprises a hollow rectangular column, a part of an amplitude amplifying portion of said mechanical vibration amplifying member of a stepped type horn, and an output portion of said mechanical vibration amplifying member including said connecting portion with said increased thickness portion tangentially contacting said outer circumferential surface of said hollow rectangular column, and a convex portion at the end portion thereof;

said another member comprises another part of said amplitude amplifying portion, having a flange portion, of said mechanical vibration amplifying member, and having a concave portion at the end portion thereof; and said ultrasonic wave transducer comprises a cylindrical metal block having a flange portion, circular piezoelectric elements and an electrode plate sandwiched between said flange portion of said stepped type horn and said flange portion of said cylindrical metal block by a plurality of bolts which also extend through an annular spacer member interposed between said flange portions and surrounding said elements and said electrode;

said convex portion of said one member mating with said concave portion of said another member being secured together by bolt means passing through said concave and convex portions, whereby said one and said another members are integrally formed as one body.

11. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said ultrasonic vibratory member and said other end of said mechanical vibration amplifying member form one integral member;

said one member is integrally secured to one end of another member having the other end thereof integrally secured to said ultrasonic wave transducer by fixing means;

said one member comprises a hollow cylinder having a slit like opening extending in the axial direction thereof and a triangular column projection which is integral with the outer cylindrical wall thereof and which extends in a direction parallel with the longitudinal axis over the entire length thereof, and a part of an amplitude amplifying portion of said mechanical vibration amplifying member of a stepped type horn, the output portion of said stepped type horn including said connecting portion with said increased thickness portion tangentially contacting said outer circumferential surface of said hollow cylinder and having a convex portion at the end portion thereof;

said another member comprises another part of said amplitude amplifying portion, having a flange portion, of said mechanical vibration amplifying member, and having a concave portion at the end portion thereof secured to said convex portion of said one member by bonding means such as brazing; and said ultrasonic wave transducer comprises a magnetostrictive element within which a lead wire is wound for several turns around a U-shaped member which is secured to a cylindrical metal block of said mechanical vibration amplifying member which is in turn secured to said flange portion of said mechanical vibration amplifying member by adhesive means.

12. An ultrasonic wave generator comprising:

an ultrasonic wave oscillator;

an ultrasonic wave transducer, connected to said ultrasonic wave oscillator, for transforming an electrical oscillation from said oscillator into a mechanical vibration;

a mechanical vibration amplifying member, having one end thereof integrally secured to one end of said ultrasonic wave transducer, for amplifying the amplitude of said mechanical vibration transmitted from said ultrasonic wave transducer;

an ultrasonic vibratory member of a hollow cylindrical body which is open at both ends thereof, which has a side circular wall having a predetermined length between said ends and a constant predetermined wall thickness in the axial direction thereof, and which has its outer circumferential surface integrally connected to the other end of said mechanical vibration amplifying member, with the longitudinal axis thereof being disposed perpendicularly to the longitudinal axis of said mechanical vibration amplifying member; and an increased thickness portion which projects from said circumferential surface of said ultrasonic vibratory member and/or from a side wall portion of said mechanical vibration amplifying member at the connecting portion of said ultrasonic vibratory member and said mechanical vibration amplifying member, and which is integrally formed upon said ultrasonic vibratory member and said mechanical vibration amplifying member in such a manner that the cross-sectional area of said connecting portion of said ultrasonic vibratory member and said mechanical vibration amplifying member gradually changes, whereby the mechanical strength of said connecting portion between said ultrasonic vibratory member and said mechanical vibration amplifying member is increased so as to prevent fatigue failure and cracking within said connecting portion, and the positive transmission of ultrasonic waves from said mechanical vibration amplifying member to said ultrasonic vibratory member is insured so as to generate ultrasonic waves from said ultrasonic vibratory member in a stable manner for a long period of time;

said ultrasonic vibratory member and said other end of said mechanical vibration amplifying member form one integral member;

said one member is integrally secured to one end of another member having the other end thereof integrally secured to said ultrasonic wave transducer by fixing means;

said one member and said another member have elongated bores having threaded wall portions provided in such a manner as to extend through said one and another members in the axial direction and in coaxial relation with respect to each other; and said fixing means comprises bolt means having a threaded portion and extending substantially the entire length of said one and said another members for integrally securing said one and said another members to each other;

said one member comprises a hollow cylinder having a rectangular columnar projection which is integral with the outer cylindrical wall thereof and which extends in a direction parallel with the longitudinal axis and over the entire length thereof, a part of an amplitude amplifying portion of a stepped type horn of said mechanical vibration amplifying member, said connecting portion including said increased thickness portion tangentially contacting said outer circumferential surface of said hollow cylinder and having arcuate cuts defined in a manner to be smoothly united with said outer circumferential surface of said hollow cylinder and positioned in opposing relation with respect to each other, said cuts also extending axially of said vibratory member, a threaded bore being coaxially provided within said one member and extending along the entire length thereof;

said another member comprises another part of said amplitude amplifying portion, having a flange portion, of said mechanical vibration amplifying member and including a threaded bore coaxially provided within said another member extending along the entire length thereof;

said one and said another members are secured together by a bolt having a length equal to the length of said bores within said one and said another members; and said ultrasonic wave transducer comprises a cylindrical metal block having a flange portion, circular piezoelectric elements and an electrode plate being sandwiched between said flange portions of said stepped type horn and said cylindrical metal block and secured therein by a plurality of bolts which also extend through an annular spacer member interposed between said flange portions and surrounding said elements and said electrode.

13. An ultrasonic wave generator according to claim 4, wherein:

said ultrasonic vibratory member is secured to said amplified mechanical vibration output portion by bolt means;

said mechanical vibration input portion of said mechanical vibration amplifying member is secured to said first cylindrical body of said ultrasonic wave transducer by bolt means; and said first cylindrical body, said second cylindrical body, said circular piezoelectric elements, and said electrode plate of said ultrasonic wave transducer are integrally secured together by adhesive means.

* * * * *

UNITED STATES PATENT AND TRADEMARK OFFICE

CERTIFICATE OF CORRECTION

PATENT NO. : 4,074,152

DATED : February 14, 1978

INVENTOR(S) : Asai et al

It is certified that error appears in the above-identified patent and that said Letters Patent are hereby corrected as shown below:

Under section [30] Foreign Application Priority Data, please insert the following priority dates and their corresponding application numbers:

--Sept. 30, 1974 Japan..............49-113148

Aug. 22, 1975 Japan..............50-102322--

Signed and Sealed this

*Fifteenth* Day of *August 1978*

[SEAL]

*Attest:*

RUTH C. MASON
*Attesting Officer*

DONALD W. BANNER
*Commissioner of Patents and Trademarks*